US008525199B2

(12) United States Patent
Konishi

(10) Patent No.: US 8,525,199 B2
(45) Date of Patent: Sep. 3, 2013

(54) SOLID-STATE IMAGE CAPTURING DEVICE, METHOD FOR MANUFACTURING THE SAME AND ELECTRONIC INFORMATION DEVICE

(75) Inventor: Tomohiro Konishi, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 952 days.

(21) Appl. No.: 12/227,380

(22) PCT Filed: May 15, 2007

(86) PCT No.: PCT/JP2007/059989
§ 371 (c)(1),
(2), (4) Date: Aug. 13, 2009

(87) PCT Pub. No.: WO2007/132866
PCT Pub. Date: Nov. 22, 2007

(65) Prior Publication Data
US 2010/0025788 A1    Feb. 4, 2010

(30) Foreign Application Priority Data
May 16, 2006   (JP) ................................. 2006-136667

(51) Int. Cl.
*H01L 27/14*   (2006.01)

(52) U.S. Cl.
USPC ............. 257/98; 362/268; 359/131; 359/362; 359/435; 369/99; 348/291; 348/E13.013; 348/E13.032

(58) Field of Classification Search
USPC ........... 362/268; 359/131, 362, 435; 369/99; 348/291, E13.013, E13.032; 347/137, 244; 257/432, 98, 294, E33.073
See application file for complete search history.

(56) References Cited

U.S. PATENT DOCUMENTS

| | | | | |
|---|---|---|---|---|
| 5,990,506 A | * | 11/1999 | Fossum et al. | ................ 257/294 |
| 2005/0161584 A1 | | 7/2005 | Tanaka et al. | |
| 2007/0158713 A1 | | 7/2007 | Ohkawa | |

FOREIGN PATENT DOCUMENTS

| | | |
|---|---|---|
| JP | 05-243543 | 9/1993 |
| JP | 05-346556 | 12/1993 |
| JP | 06-163866 | 6/1994 |
| JP | 10-229180 | 8/1998 |
| JP | 2000-039503 | 2/2000 |

(Continued)

OTHER PUBLICATIONS

International Search Report, Aug. 14, 2007, issued in PCT/JP2007/059989.
Taiwanese Office Action dated Jan. 27, 2011 issued in application No. (02)23767413.

*Primary Examiner* — Julio J Maldonado
*Assistant Examiner* — Mohammad Choudhry
(74) *Attorney, Agent, or Firm* — Edwards Wildman Palmer LLP; David G. Conlin; George N. Chaclas

(57) ABSTRACT

In a solid-state image capturing device having the locations of photodiodes in each pixel unit to be different according to a sequence, the light receiving sensitivity and the luminance shading characteristic are improved. A circumferential portion of a microlens 12 which is arranged above a corresponding photodiode 11 is formed so as to overlap an adjacent microlens 12 thereto, and the locations of microlenses 12 in each pixel unit are different according to a sequence. Light of an image that is incident upon each of the microlenses 12 is incident upon approximately the same portion (e.g., central portion) of each of the respective photodiodes 11.

27 Claims, 19 Drawing Sheets

(56) References Cited

FOREIGN PATENT DOCUMENTS

| | | |
|---|---|---|
| JP | 2000039503 A | 2/2000 |
| JP | 2000-174244 | 6/2000 |
| JP | 2002-270811 | 9/2002 |
| JP | 2003-229550 | 8/2003 |
| JP | 2003273342 A | 9/2003 |
| JP | 2005109001 * | 4/2005 |
| JP | 2005-244947 | 9/2005 |
| JP | 20061214105 | 5/2006 |

* cited by examiner

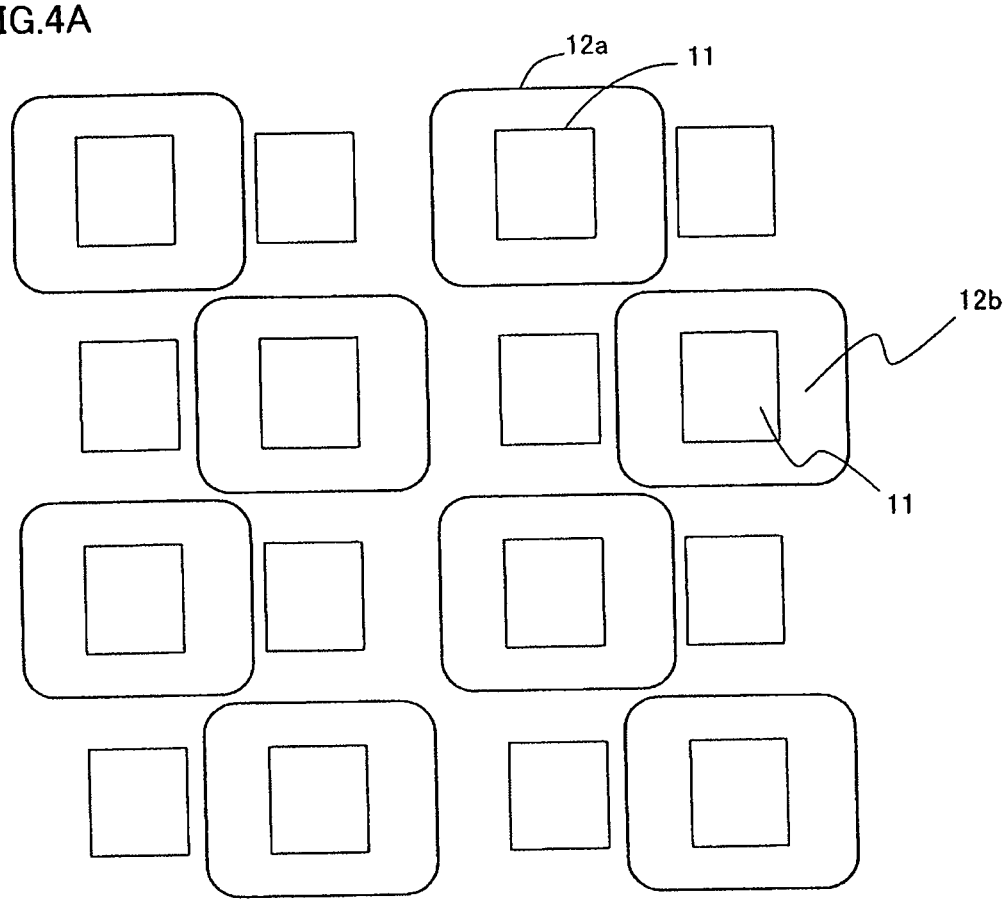

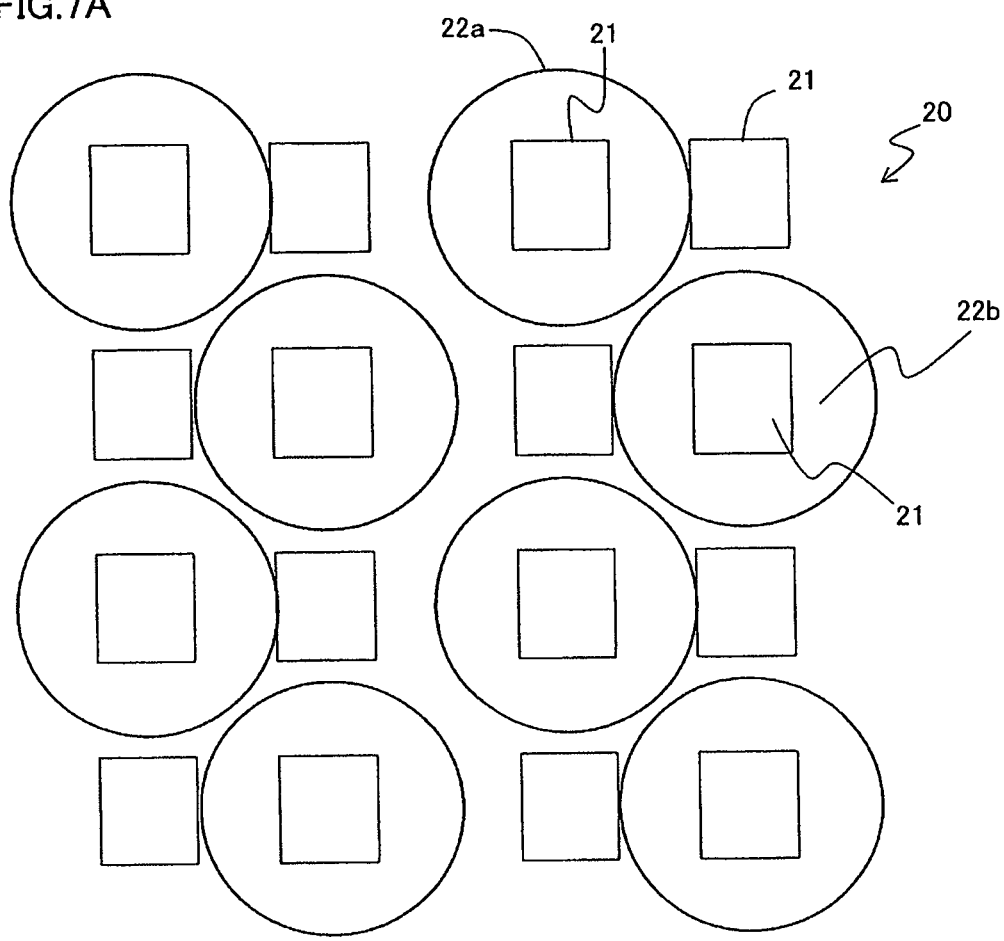

SOLID-STATE IMAGE CAPTURING DEVICE, METHOD FOR MANUFACTURING THE SAME AND ELECTRONIC INFORMATION DEVICE

TECHNICAL FIELD

The present invention relates to: a solid-state image capturing device in which the locations of adjacent photoelectrical conversion sections in each pixel unit are different according to a sequence, and the light of an image from a subject is photoelectrically converted at each of the photoelectrical conversion sections and is then image-captured as a pixel; a method for manufacturing the solid-state image capturing device and; and an electronic information device (e.g., digital camera (digital video camera, digital still camera or the like), image input camera, scanner, facsimile, cell phone device equipped with camera and the like) using the solid-state image capturing device as an image input device for an image capturing section thereof.

BACKGROUND ART

Recently, in a conventional solid-state image capturing device such as a CCD image sensor or CMOS image sensor, the reduction of the size of a pixel cell have been extensively performed. In particular, in a CMOS image sensor, in order to reduce the size of a pixel cell, the reduction of the number of transistors required per pixel has rapidly progressed by having a plurality of photodiodes (light receiving sections; photoelectrical conversion sections) sharing one output amplifier.

Herein, first, a case will be described with reference to FIG. 14 in which one output amplifier is provided for one photodiode, and photodiodes are arranged at even intervals in a matrix in a row direction and a column direction. Next, a case will be described with reference to FIGS. 15 to 17 in which one output amplifier is shared by two photodiodes, and the locations of photodiodes are different according to a sequence.

FIG. 14 is a longitudinal cross-sectional view schematically showing an exemplary essential structure of a pixel section in a conventional solid-state image capturing device 100.

In the conventional solid-state image capturing device 100 in FIG. 14, a microlens 2 is arranged above each photodiode 1 making up a pixel so as to correspond to the photodiode 1. Light of an image that is incident on pixels is focused by microlenses 2, and then it is incident upon photodiodes 1. The incident light upon the photodiodes 1 is photoelectrically converted at the photodiodes 1.

FIG. 15 is a longitudinal cross-sectional view schematically showing an exemplary essential structure of a pixel section in another conventional solid-state image capturing device 100A.

In the conventional solid-state image capturing device 100A in FIG. 15, the location of each of the adjacent photodiodes 1A is different in each pixel. For example, in a CMOS image sensor or the like, when one output amplifier is shared by a plurality of photodiodes, the locations of adjacent photodiodes 1A are not at even intervals, as shown in FIG. 15. The two adjacent photodiodes 1A in each group are located close to each other. A microlens 2A is provided above a corresponding photodiode 1A making up a pixel. However, the center position of the microlens 2A does not match the center position of the photodiode 1A in a plane view. Light of an image that is incident upon each of the microlens 2A from right above is not focused upon the central portion of each of the respective photodiodes 1A.

Here is shown a case in which the light of an image is incident on the microlenses 2A from right above. In this case, light of an image is incident upon microlenses 2A from right above at the central portion of a light receiving region. However, light of an image is incident upon the microlenses 2A from an oblique direction at a peripheral portion of the light receiving region. Next, this case will be described with reference to FIG. 16.

FIG. 16 is a longitudinal cross-sectional view schematically showing the light focusing characteristic of the solid-state image capturing device 100A in FIG. 15 with respect to light incident from an oblique direction.

As shown in FIG. 16, when light of an image is incident upon each microlens 2A from an oblique direction, the light focusing position on a photodiode 1A is different for each pixel. The light cannot be focused upon the central portion of the photodiode 1A. As such, the light receiving sensitivity of the photodiode 1A is reduced. In addition, the light cannot be focused upon the same portion on each of the photodiodes 1A, and the light focusing characteristic is different from each other in each pixel, thus showing a different luminance shading characteristic in each pixel.

In order to solve such problems, for example, Reference 1 proposes a conventional solid-state image capturing device to be described below. This will be described with reference to FIG. 17.

FIG. 17 is a longitudinal cross-sectional view schematically showing an exemplary essential structure of a pixel section in another conventional solid-state image capturing device 100B disclosed in Reference 1.

In the conventional solid-state image capturing device 100B in FIG. 17, the location of each of the adjacent photodiodes 1B is different, and the locations of two adjacent photodiodes 1B in each group are close to each other. A common convex-spherical transparent portion 3 is provided for each group of two pixels. Two microlenses 2B are formed on the convex-spherical transparent portion 3 so as to change the light focusing direction inward, so that light of an image can be incident upon the central portion on each of photodiodes 1B.

As described above, in the solid-state image capturing device (CCD image sensor) 100B having photodiodes 1B in a two-pixel unit and the locations of the photodiodes 1B in each two-pixel unit are different according to a sequence, the direction of the incident light is bent by the inclination of the surface of the convex-spherical transparent portion 3 provided to cover two-pixels. Thus, the light is more likely to be incident upon the central portion on each of the photodiodes 1B.

Reference 2 discloses another conventional solid-state image capturing device in which one output amplifier is provided for one photodiode, and the photodiodes are arranged at even intervals in a matrix in a row direction and a column direction, similar to FIG. 14. In such a case, adjacent microlenses are attached to each other in order to eliminate a light invalid region due to a gap between the adjacent microlenses.

Reference 1: Japanese Laid-Open Publication No. 2002-270811

Reference 2: Japanese Laid-Open Publication No. 2003-229550

DISCLOSURE OF THE INVENTION

As described above, in the conventional solid-state image capturing device 100 shown in FIG. 14, photodiodes 1 are arranged at even intervals in a column direction and a row direction, and the locations of a photodiode 1 and a corresponding microlens 2 match each other in a plane view. Therefore, an incident light of an image is focused upon the central portion of the photodiode 1. However, in the conventional solid-state image capturing device 100A shown in FIG. 15, the microlenses 2A are provided at even intervals above the photodiodes 1A which are arranged at uneven intervals. Therefore, the locations of a photodiode 1A and a corresponding microlens 2A do not match each other in a plane view, and the light of an image that is incident upon each of the microlenses 2A is not incident upon the central portion of each of the respective photodiodes 1A. As such, the following problems occur.

First, the light receiving sensitivity will be examined. Generally, light of an image that is incident from a microlens and then focused upon a CCD sensor or CMOS sensor includes oblique incident light in accordance with F number. When the curvature of a microlens is not constant, light of an image is not focused upon one point. Even when light of an image is incident from right above, the light of the image is focused with some degree of spread. In consideration of this, light of an image to be incident upon a photodiode is not focused upon one point, but is distributed about the center of a certain point having some degree of spread. As such, it is recognized that a better light receiving sensitivity is obtained if the light of an image that is incident from right above is focused upon the central portion of a photodiode as much as possible. For the reasons described above, in the conventional solid-state image capturing device 100A shown in FIG. 15, the light receiving sensitivity with respect to the light of an image, including oblique incident light, is further reduced from that for the conventional solid-state image capturing device 100 shown in FIG. 14.

Second, the luminance shading will be examined. The luminance shading is a ratio of the light receiving sensitivity at a periphery of a chip of a CCD sensor or CMOS sensor (edge portion of a light receiving region) with respect to the light receiving sensitivity at the center of the chip of the CCD sensor or CMOS sensor (central portion of the light receiving region). Generally, the incident angle (angle with respect to a line perpendicular to a substrate surface) of light of an image that is incident upon a CCD sensor or CMOS sensor from a microlens increases toward a peripheral position from the center position of a chip (more inclined from the perpendicular line). The distance to a microlens viewed from a CCD sensor or CMOS sensor side is called exit pupil position. The incident angle with which light of an image is incident at a peripheral portion of a chip of a CCD sensor or CMOS sensor changes in accordance with the exit pupil position. Oblique incident light at a peripheral portion of a chip is focused upon a different location at a photodiode 1A in each pixel, as shown in FIG. 16. As such, it is difficult to improve the luminance shading characteristic in every pixel at the same time. As a result, problems of not only deteriorating the luminance shading characteristic, but also making the luminance shading characteristic different in each pixel occur.

In order to solve such problems, as described above, in the another conventional solid-state image capturing device 100B disclosed in Reference 1, a convex-spherical transparent portion 13 is commonly provided for two pixels, two microlenses 2B are formed on the convex-spherical transparent portion 13 so as to change the light focusing direction, and light is incident upon the central portion of each of the photodiodes 1B, as shown in FIG. 17.

However, in another conventional solid-state image capturing device 100B shown in FIG. 17, two microlenses 2B are formed on a convex-spherical transparent portion 3. As such, the another conventional solid-state image capturing device 100B has the problems to be described below. First, the surface of a microlens is concave-convex at the time of manufacturing the microlens. As such, there is a problem that it is difficult to process a microlens 2B. Second, the positions of a convex-spherical transparent portion 3 and microlenses 2B have to be aligned. Thus, the alignment has to be controlled at high precision. Third, the angle of light that is incident upon on a photodiode 1B from a corresponding microlens 2B depends on the shape of a convex-spherical transparent portion 3. As such, there is a problem that it is difficult to make the light of an image to be incident optimally in accordance with the positions of adjacent photodiodes 1B.

On the other hand, in the another conventional solid-state image capturing device disclosed in Reference 2, photodiodes are arranged at even intervals, and the center position of a photodiode and the optical axis of a corresponding microlens originally match each other. Outer-peripheral portions of microlenses are extended, and adjacent microlenses are attached to each other in order to eliminate the light invalid region due to a gap between the microlenses. The prerequisite technique, the technical concept and the structure of Reference 2 are totally different from those of the present invention, which will be described later in detail. In the present invention, two microlenses are brought inward and the distance there between is reduced so as to attach the two microlenses to each other, so that the optical axis of each of the two microlenses matches the center position of each of the respective two photodiodes when one output amplifier is shared by two photodiodes, and the locations of the photodiodes in each pixel unit are different according to a sequence in order to reduce the size of a pixel cell, as shown in FIG. 15 to FIG. 17.

The present invention is intended to solve the conventional problems described above. The objective of the present invention is to provide: a solid-state image capturing device which is capable of preventing the reduction of the sensitivity with respect to the light of an image including oblique incident light, capable of preventing the decrease and the ununiformity of the luminance shading characteristic, also capable of making light of an image to be optimally incident in accordance of the location of a photodiode and which is easily processed; a method for manufacturing the solid-state image capturing device; and an electronic information device using the solid-state image capturing device for an image capturing section thereof.

A solid-state image capturing device according to the present invention includes: a plurality of light receiving sections arranged such that the locations thereof in each pixel unit are different according to a sequence; and microlenses arranged above the plurality of light receiving sections so as to correspond to the plurality of light receiving sections, wherein some or all of adjacent microlenses among the microlenses are close to each other such that their respective peripheral portions overlap, and the microlenses are formed with a shape of lens where overlapped lens portions thereof are cut off so the microlenses are adjacent to each other such that light incident upon each of the microlenses is focused upon the same position on a corresponding light receiving section, thereby the objective described above being achieved.

Preferably, in a solid-state image capturing device according to the present invention, the adjacent microlenses are formed such that at least apart of the peripheral portions of the microlenses overlaps adjacent microlenses thereto.

Still preferably, in a solid-state image capturing device according to the present invention, the adjacent microlenses are formed such that the adjacent microlenses having a shape of lens with the overlapped lens portions thereof cut off are arranged so as to be in contact with each other.

Still preferably, in a solid-state image capturing device according to the present invention, the adjacent microlenses are formed such that the adjacent microlenses having a shape of lens with the overlapped lens portions thereof cut off are arranged so as to be away from each other by a predetermined gap.

Still preferably, in a solid-state image capturing device according to the present invention, the locations of the microlenses are different in accordance with gaps between the respective light receiving sections.

Still preferably, in a solid-state image capturing device according to the present invention, the light receiving sections and the microlenses are arranged such that the locations of the light receiving sections and the microlenses in each two-pixel unit are different according to a sequence.

Still preferably, in a solid-state image capturing device according to the present invention, the light receiving sections and the microlenses are arranged such that the locations of the light receiving sections and the microlenses in each N-pixel unit (N is an integer greater than or equal to 3) are different according to a sequence.

Still preferably, in a solid-state image capturing device according to the present invention, the light receiving sections and the microlenses are arranged in a matrix, and the locations of the light receiving sections and the microlenses in each four-pixel unit are different according to a sequence with two out of four light receiving sections and corresponding two out of four microlenses being arranged in a row direction and the other two light receiving sections and microlenses being arranged in a column direction.

Still preferably, in a solid-state image capturing device according to the present invention, the light receiving sections and the microlenses are arranged in a matrix, and the locations of the light receiving sections and the microlenses in each K pixel unit (K=I×J), with I pixels (I is an integer greater than or equal to 2) in a row direction and J pixels (J is an integer greater than or equal to 2) in a column direction, are different according to a sequence.

Still preferably, in a solid-state image capturing device according to the present invention, the light receiving sections and the microlenses are arranged such that the locations of the light receiving sections and the microlenses in each two-pixel unit are different according to a sequence, and two microlenses are arranged above two adjacent light receiving sections in each two-pixel unit so as to correspond to the two adjacent light receiving sections, and the two microlenses overlap or are in contact with each other.

Still preferably, in a solid-state image capturing device according to the present invention, the light receiving sections and the microlenses are arranged in a matrix, and the locations of the adjacent microlenses in each two-pixel unit are different according to a sequence in one of a row direction and a column direction.

Still preferably, in a solid-state image capturing device according to the present invention, the light receiving sections and the microlenses are arranged such that the locations of the light receiving sections and the microlenses in each N-pixel unit (N is an integer greater than or equal to 3) are different according to a sequence, and N microlenses in each N-pixel unit (N is an integer greater than or equal to 3) are arranged above N adjacent light receiving sections so as to correspond to the N adjacent light receiving sections, and the N microlenses overlap or are in contact with each other.

Still preferably, in a solid-state image capturing device according to the present invention, the light receiving sections and the microlenses are arranged in a matrix, and the locations of the adjacent microlenses in each N-pixel unit (N is an integer greater than or equal to 3) are different according to a sequence in one of a row direction and a column direction.

Still preferably, in a solid-state image capturing device according to the present invention, the light receiving sections and the microlenses are arranged in a matrix, and the locations of the microlenses in each four-pixel unit are different according to a sequence with two out of four light receiving sections and corresponding two out of four microlenses being arranged in a row direction and the other two light receiving sections and microlenses being arranged in a column direction, and the four microlenses are arranged above four adjacent light receiving sections in each four-pixel unit so as to correspond to the four adjacent light receiving sections, and the four microlenses overlap or are in contact with each other.

Still preferably, in a solid-state image capturing device according to the present invention, the light receiving sections and the microlenses are arranged in a matrix, and the locations of the microlenses in each K-pixel unit (K=I×J) are different according to a sequence with I pixels (I is an integer greater than or equal to 2) in a row direction and J pixels (J is an integer greater than or equal to 2) in a column direction, and the microlenses are arranged above adjacent light receiving sections in each K-pixel unit so as to correspond to the adjacent light receiving sections, and the microlenses overlap or are in contact with each other.

Still preferably, in a solid-state image capturing device according to the present invention, a shape of the microlens is formed in a circular, an approximate circular or an ellipse in a plain view, and a curvature thereof set to be constant.

Still preferably, in a solid-state image capturing device according to the present invention, peripheral portions of the microlens are formed so as to overlap or be in contact with adjacent microlenses thereto in two directions, both of the lateral directions or both of the longitudinal directions, or in four directions, both of the lateral directions and both of the longitudinal directions.

Still preferably, in a solid-state image capturing device according to the present invention, the microlenses which are located above the respective light receiving sections are formed so as to overlap each other with a large amount thereof at the location where adjacent light receiving sections are positioned close to each other, and the microlenses which are located above the respective light receiving sections are formed so as to overlap each other with a small amount thereof at the location where adjacent light receiving sections are positioned far from each other.

Still preferably, in a solid-state image capturing device according to the present invention, the locations of the microlenses in each pixel unit are different according to a sequence, and the relative positions between the light receiving sections and the respective microlenses are offset from the center of a chip toward a periphery of the chip, so that light is focused on each of the light receiving sections.

Still preferably, in a solid-state image capturing device according to the present invention, the location on each of the light receiving sections upon which light is focused is the central portion on each of the light receiving sections.

Still preferably, in a solid-state image capturing device according to the present invention, the location on each of the light receiving sections upon which light is focused is a predetermined positional range on the light receiving section which shows the same luminance characteristic in each pixel.

Still preferably, in a solid-state image capturing device according to the present invention, the location on each of the light receiving sections upon which light is focused is the same position on each of the light receiving sections.

Still preferably, in a solid-state image capturing device according to the present invention, the location on each of the light receiving sections upon which light is focused is the central portion on each of the light receiving sections.

Still preferably, in a solid-state image capturing device according to the present invention, the light receiving sections are photoelectrical conversion sections for performing a photoelectrical conversion on light.

Still preferably, the solid-state image capturing device according to the present invention is a CCD image sensor or a CMOS image sensor.

Still preferably, in a solid-state image capturing device according to the present invention, one output amplifier is shared by each group of a predetermined number of light receiving sections.

A solid-state image capturing device manufacturing method according to the present invention for manufacturing a solid-state image capturing device according to the present invention includes: a first step of forming microlenses, which do not contact each other, among a plurality of microlenses; and a second step of forming microlenses, which do not contact each other, among the plurality of microlenses which are not yet formed, in at least one of a row direction and a column direction such that they overlap or are in contact with the previously formed adjacent microlenses, wherein the second step is repeated until there is no microlens among the plurality of microlenses which has been not formed yet, thereby the objective described above being achieved.

A solid-state image capturing device manufacturing method according to the present invention for manufacturing a solid-state image capturing device according to the present invention includes the step of: forming adjacent microlenses having a shape of lens with overlapped lens portions thereof cut off in at least one of a row direction and a column direction so as to be in contact with each other or so as to be away from each other by a predetermined gap, thereby the objective described above being achieved.

An electronic information device according to the present invention is provided, which uses a solid-state image capturing device according to the present invention for an image capturing section thereof, thereby the objective described above being achieved.

Hereinafter, the functions of the present invention having the structures described above will be described.

According to the present invention, a plurality of microlenses are formed such that at least a part of the circumferential portions of the microlenses which are arranged above respective light receiving sections overlap or are in contact with adjacent microlenses. The locations of the microlenses in each pixel unit are different according to a sequence. In a solid-state image capturing device having the locations of adjacent light receiving sections in each pixel unit differ according to a sequence, the locations of microlenses in each pixel unit arranged above respective light receiving sections are different according to a sequence in a direction in which the locations of the light receiving sections in each pixel unit are arranged. As such, light that is incident upon each of the microlenses is incident upon approximately the same position (e.g., central portion or center) on the corresponding light receiving section. Therefore, it is possible to improve the light receiving sensitivity and the luminance shading characteristic, and also possible to improve the uniformity of the luminance shading characteristic.

By forming microlenses in a plurality of steps, it is possible to easily set the microlenses at the optimal positions, respectively, while maintaining the quality of microlenses, in consideration of the location, light receiving sensitivity and luminance shading characteristic of each of the photodiodes.

As described above, according to the present invention, in a solid-state image capturing device having the locations of adjacent light receiving sections in each pixel unit be different according to a sequence, the locations of the microlenses in each pixel unit are different according to a sequence in a direction in which the locations of the light receiving sections are in each pixel unit are different according to a sequence. As such, it is possible to improve the light receiving sensitivity in each pixel and also possible to improve the luminance shading characteristic in each pixel. In addition, light of an image can be incident upon approximately the same position on each of the light receiving sections. Therefore, it is possible to make the luminance shading characteristic uniform in the pixels having different locations according to a sequence in each pixel unit.

BRIEF DESCRIPTION OF THE DRAWINGS

FIG. 4A is a partial plane view for describing a manufacturing step (1) in a method for manufacturing the solid-state image capturing device according to Embodiment 1.

FIG. 7A is a partial view for describing a manufacturing step (1) in a method for manufacturing the solid-state image capturing device according to Embodiment 2.

Figure 1:
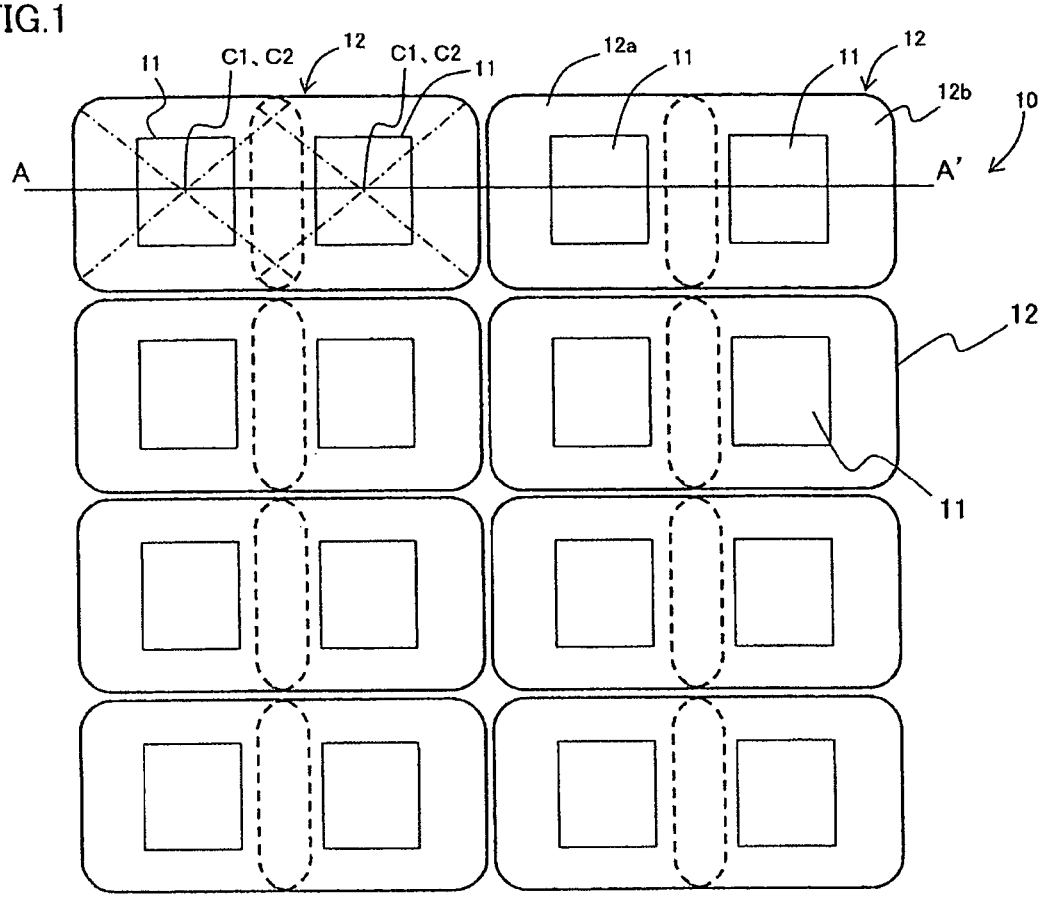
FIG. 1 is a plane view showing an exemplary essential structure of a pixel section in a solid-state image capturing device according to Embodiment 1 of the present invention.

10, 20, 30, 40, 50, 50A solid-state image capturing device
11, 21, 31, 41, 51 photodiode
12, 22, 32, 42A, 42B, 52 microlens
12a, 22a, 32a, 42Aa, 52a first microlens
12b, 22b 32b, 42Ab, 52b second microlens
32c, 42Ba, 52c third microlens
32d, 42Bb, 52d fourth microlens

BEST MODE FOR CARRYING OUT THE INVENTION

Hereinafter, Embodiments 1 to 5 of a solid-state image capturing device according to the present invention will be described in detail with reference to the accompanying drawings.

Embodiment 1

Figure 2:
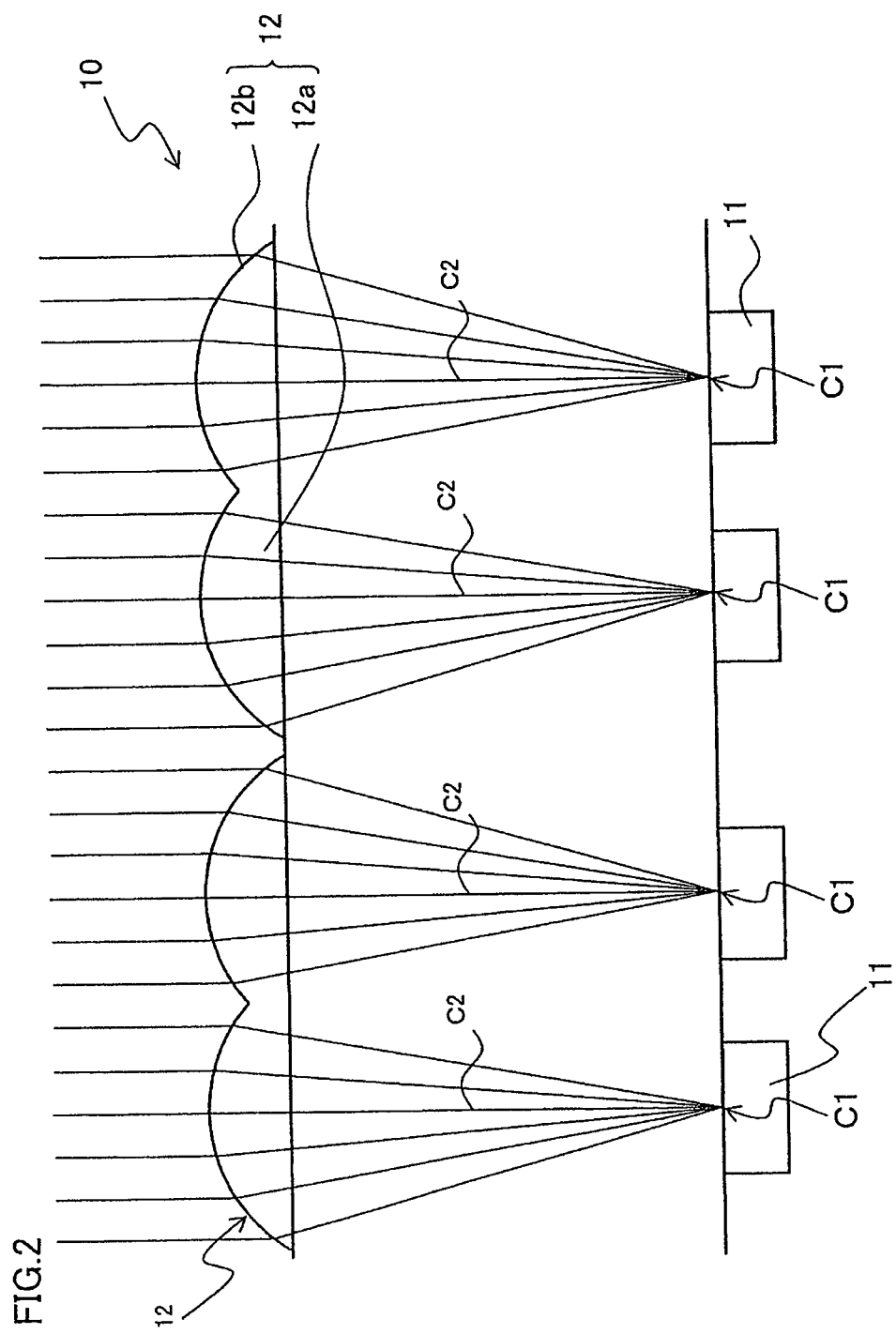
FIG. 2 is a longitudinal cross-sectional view schematically showing a portion cut at line A-A' in FIG. 1.

FIG. 1 is a plane view showing an exemplary essential structure of a pixel section in a solid-state image capturing device 10 according to Embodiment 1 of the present invention. FIG. 2 is a longitudinal cross-sectional view schematically showing a portion cut at line A-A' in FIG. 1.

In FIG. 1 and FIG. 2, the solid-state image capturing device 10 according to Embodiment 1 includes: a plurality of photodiodes 11 as a plurality of light receiving sections arranged such that the locations thereof in each pixel unit are different according to a sequence; and microlens 12 arranged above the plurality of photodiodes 11 so as to correspond to the plurality of photodiodes 11. When some or all of the adjacent microlenses 12 among the microlenses 12 are close to each other such that the peripheral portions of the microlenses 12 overlap, the microlenses 12 having a shape of lens with the overlapped lens portions thereof straightly cut off are formed so the microlenses 12 are adjacent to each other, so that the light of an image that is incident upon each of the microlenses 12 is focused upon the same position on the corresponding photodiode 11.

One microlens 12 is arranged above photodiodes 11 making up two pixels in a lateral direction so as to correspond to the photodiodes 11. This one microlens 12 includes two microlenses 12a and 12b which correspond to two adjacent photodiodes 11, respectively, in a lateral direction in a plane view. The center position C1 of each of the photodiodes 11 is arranged so as to match the optical axis C2 of each of the respective two microlenses 12a and 12b.

For example, in a CMOS image sensor, when one output amplifier is shared by a plurality of photodiodes (herein, two photodiodes), adjacent photodiodes may not be arranged at even intervals. In Embodiment 1, the location of each of the adjacent photodiodes 11 in a row direction (horizontal direction) is not uniform but different in each pixel, and the locations of the photodiodes 11 in each two-pixel unit are different according to a sequence.

Two microlenses 12 which are located above the respective photodiodes 11 making up pixels are formed so as to overlap each other at the location where the two adjacent photodiodes 11 are close, so that the microlenses 12 are arranged right above the photodiodes 11 so as to correspond to the photodiodes 11. As such, microlenses 12 are arranged at even intervals in each group of two pixels in a direction in which the locations of photodiodes 11 in each pixel unit are different according to a sequence (row direction) (or the locations of microlenses 12 are different according to a sequence in each two-pixel unit). In other words, the interval between two microlenses 12 in each two-pixel unit is different from the interval between a group of two microlenses 12 in a two-pixel unit and another group of two microlenses 12 in a two-pixel unit. The interval between the group of two microlenses 12 in a two-pixel unit and the another group of two microlenses 12 in a two-pixel unit is more distant than the interval between two microlenses 12 in a two-pixel unit.

Hereinafter, the characteristic of the solid-state image capturing device 10 according to Embodiment 1 having the structures described above will be described.

First, a case will be described with reference to FIG. 2 in which light of an image is incident from right above a microlens 12 at the central portion of a light receiving region. As shown in FIG. 2, in the central portion of a chip (central portion of the light receiving region) in the solid-state image capturing device 10, the light of an image that is incident upon each of the microlenses 12 from right above is focused upon the central portion of a corresponding one of the photodiodes 11. As described above, the light can be focused upon the central portion of the photodiode 11 by the microlens 12. Therefore, it is possible to obtain a solid-state image capturing device 10 having an excellent light receiving sensitivity and luminance shading characteristic.

Next, a case will be described with reference to FIG. 3 in which light of an image is incident from an oblique direction with respect to a microlens 12 at a peripheral portion of a light receiving region.

Figure 3:
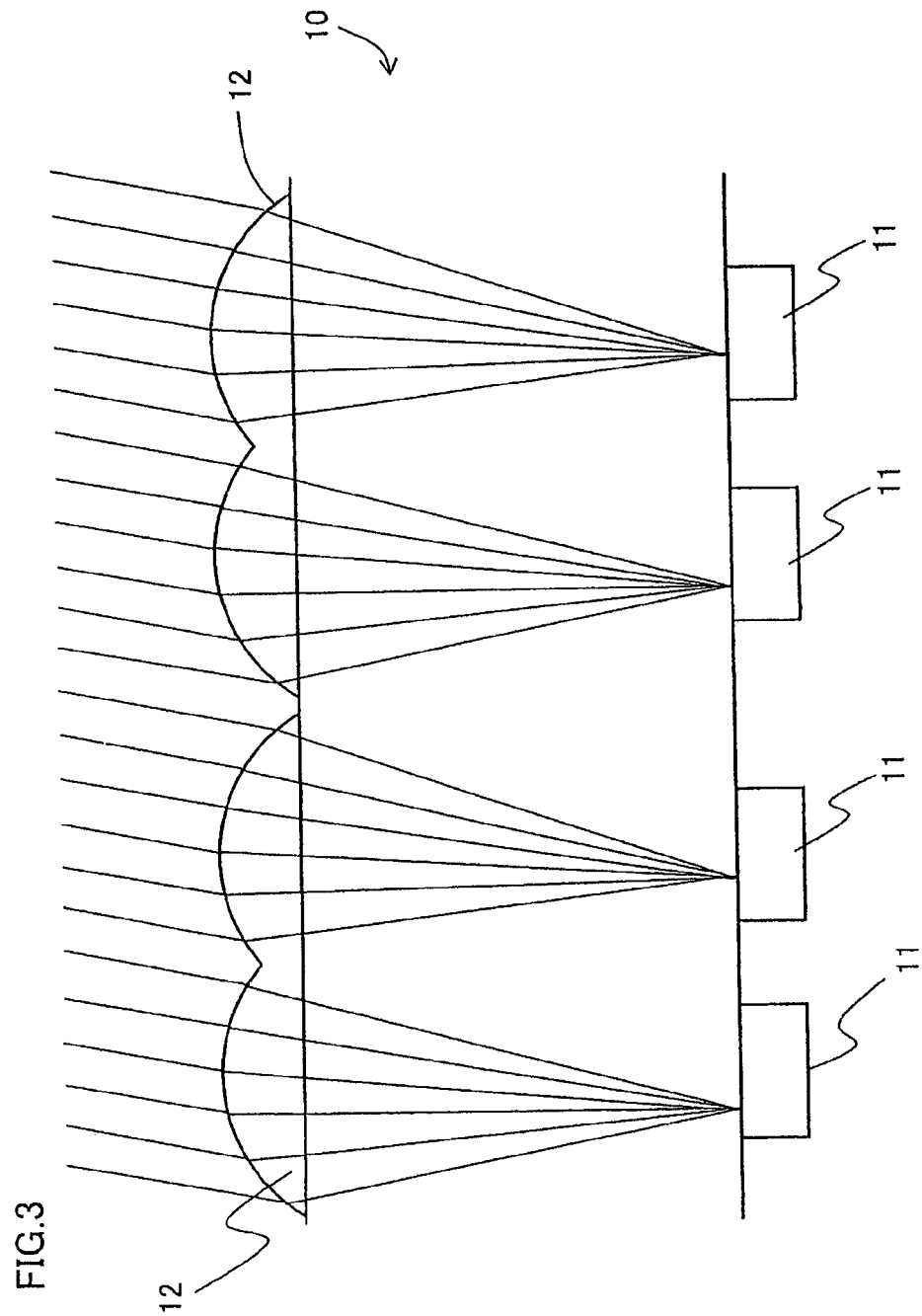
FIG. 3 is a longitudinal cross-sectional view schematically showing the light focusing characteristic with respect to the light which is incident from an oblique direction at a periphery of a chip in the solid-state image capturing device in FIG. 1.

FIG. 3 is a longitudinal cross-sectional view schematically showing the light focusing characteristic with respect to the light which is incident from an oblique direction at a periphery of a chip (edge portion of a light receiving region) in the solid-state image capturing device 10 in FIG. 1.

Figure 16:
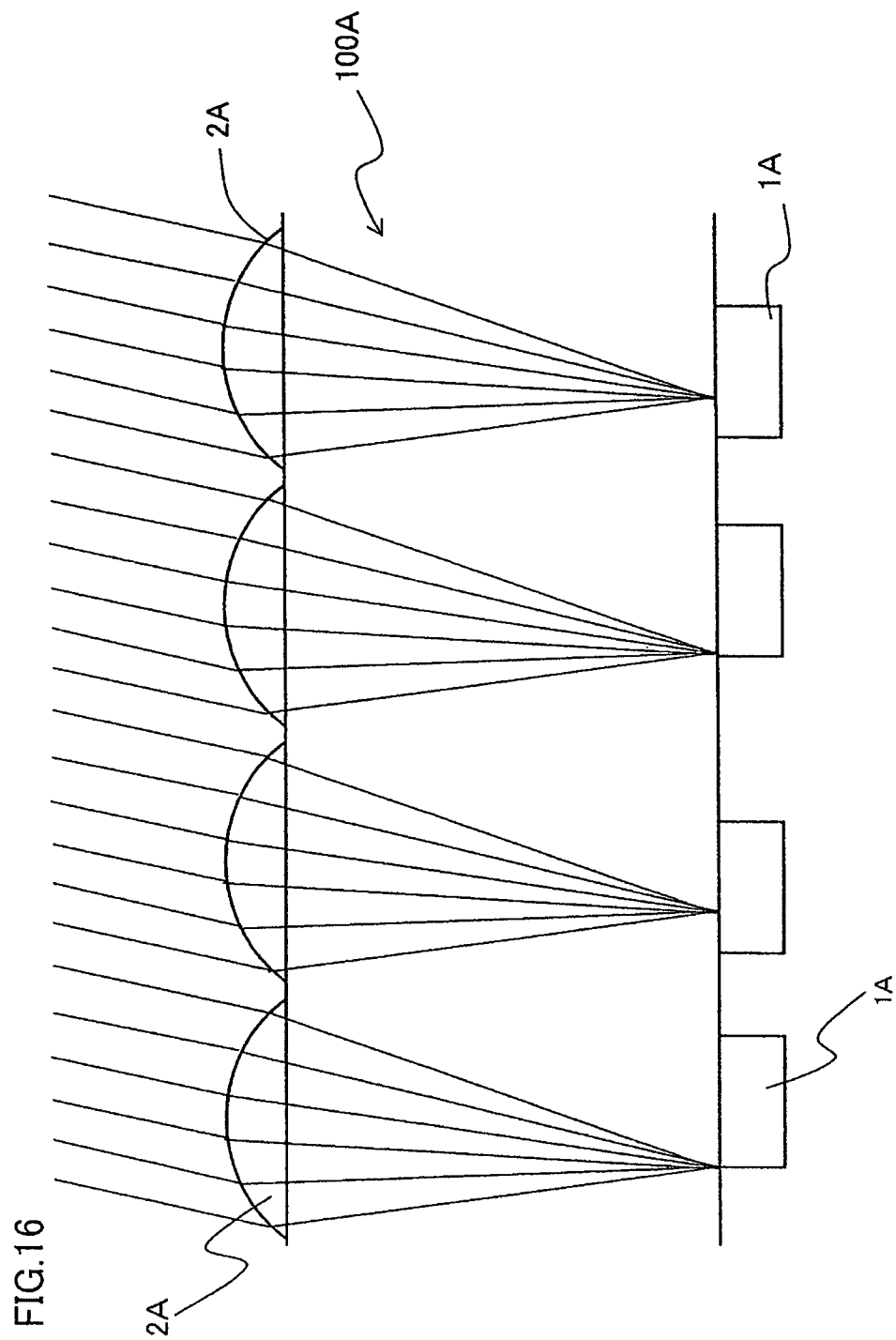
FIG. 16 is a longitudinal cross-sectional view schematically showing the light focusing characteristic of the solid-state image capturing device in FIG. 15 with respect to light incident from an oblique direction.
Figure 17:
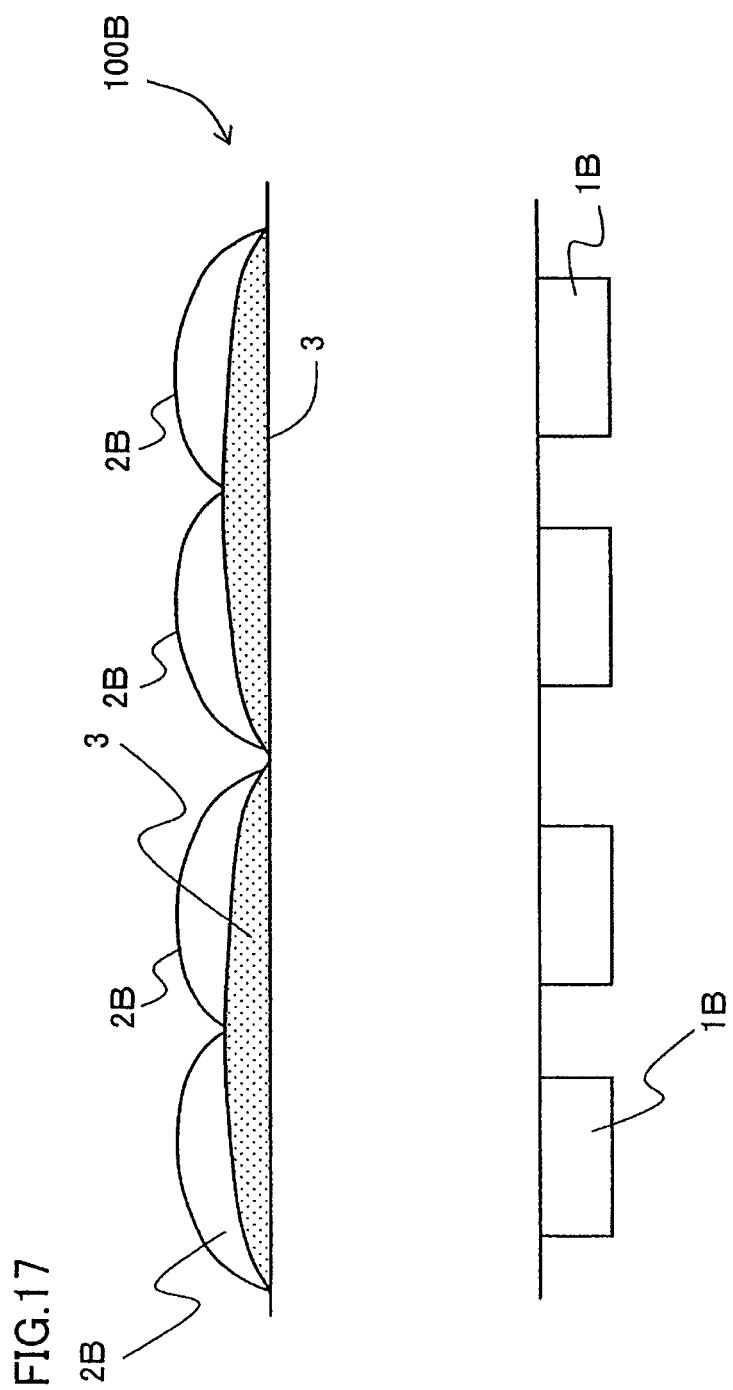
FIG. 17 is a longitudinal cross-sectional view schematically showing an exemplary essential structure of a pixel section in another conventional solid-state image capturing device disclosed in Reference 1.

In the periphery of the chip in the solid-state image capturing device 10, when oblique light is incident upon a microlens 12, the light focusing location upon a photodiode is different in each pixel in the conventional solid-state image capturing device 100A shown in FIG. 16. In contrast thereto, in the solid-state image capturing device 10 according to Embodiment 1, light can be focused upon approximately the same position (e.g., the central portion or the center) on each of the photodiodes 11, as shown in FIG. 3. Therefore, the problem that the luminance shading characteristic is different in each pixel does not occur as does in the conventional solid-state image capturing device 10A. As such, the same luminance shading characteristic in every pixel at the central portion and peripheral portions of a light receiving region can be obtained.

Hereinafter, an example of a method for manufacturing the solid-state image capturing device 10 according to Embodiment 1 will be described with reference to FIG. 4A and FIG. 4B.

Figure 4B:
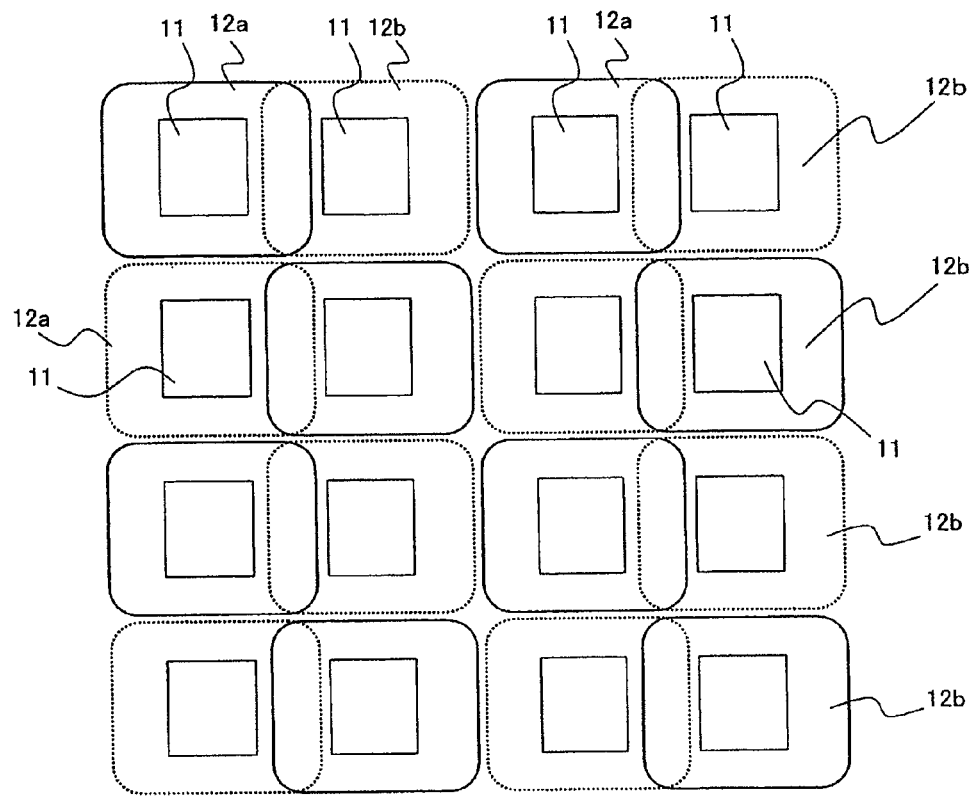
FIG. 4B is a partial plane view for describing a manufacturing step (2) in the method for manufacturing the solid-state image capturing device according to Embodiment 1.

FIG. 4A and FIG. 4B each are a partial plane view for describing the method for manufacturing the solid-state image capturing device 10 according to Embodiment 1.

First, as shown in FIG. 4A, on a substrate where a plurality of photodiodes 11 is formed in two dimensions, lens materials are provided by photolithography or the like so as to correspond to one of the two photodiodes 11 having different locations according to a sequence in each pixel unit. A thermal treatment is performed on the lens materials, so that first microlenses 12a and second microlenses 12b having a predetermined shape of lens (shape obtained by cutting a part of a sphere or approximate sphere or the like) are formed over every other photodiode 11 with no contact between each microlens. In other words, the first microlenses 12a and the second microlenses 12b enclosed by a bold line are formed over every other photodiode 11 in a checkered pattern in a row direction and a column direction.

Next, as shown in FIG. 4B, lens materials are provided by photolithography or the like so as to correspond to the other photodiode 11 of the two photodiodes 11 (the photodiodes 11 over which the first microlens 12a and the second microlens 12b are not formed) having different locations according to a sequence in each pixel unit. A thermal treatment is performed on the lens materials, so that first microlenses 12a and second microlenses 12b having a predetermined shape of lens (shape obtained by cutting a part of a sphere or approximate sphere or the like) are formed so as to overlap one sides of the respective previously-formed second microlenses 12b and first microlenses 12a which form pairs with the corresponding first microlenses 12a and second microlenses 12b.

Conventionally, when microlenses are overlapped and attached to each other, there are some cases in which the lenses are pulled away from each other after they are hardened, thus resulting in a deformation of the surface of the lenses, a cause of a crack due to the generation of the internal stress or a state in which the lenses are not usable. As such, in Embodiment 1, one of the microlenses 12 to be overlapped is formed and hardened, and then the other of the microlenses 12 to be overlapped is formed and hardened. Thus, by separately forming the microlenses 12 (first microlenses 12a and second microlenses 12b in two steps, the problem described above is solved. Therefore, even when one of the microlenses 12 overlaps the other, it is possible to bring the locations of the first microlens 12a and the second microlens 12b to form a pair close to each other in an arbitrary manner. As described above, the gap of the locations between the microlenses 12 can be reduced and the locations can be set in an arbitrary manner. Therefore, for example, the microlenses 12 can be easily arranged at the optimal locations, respectively, such that the center position C1 of each of the photodiodes 11 matches the optical axis C2 of each of the respective microlenses 12, in consideration of the location, light receiving sensitivity and shading characteristic of each of the photodiodes 11.

Embodiment 2

Embodiment 2 will describe a case in which the first microlens 2a and the second microlens 2b according to Embodiment 1 are circular (or approximate circular or elliptical) in a plane view, and the curvature thereof is constant.

Figure 5:
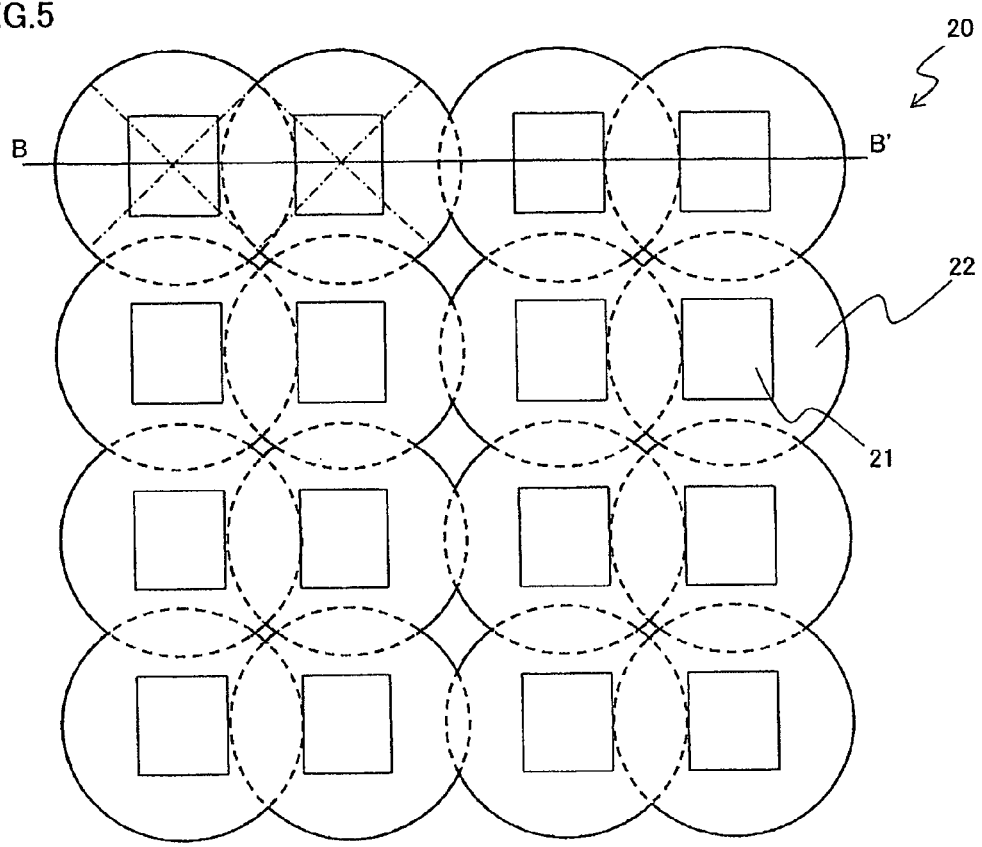
FIG. 5 is a plane view showing an exemplary essential structure of a pixel section in a solid-state image capturing device according to Embodiment 2 of the present invention.
Figure 6:
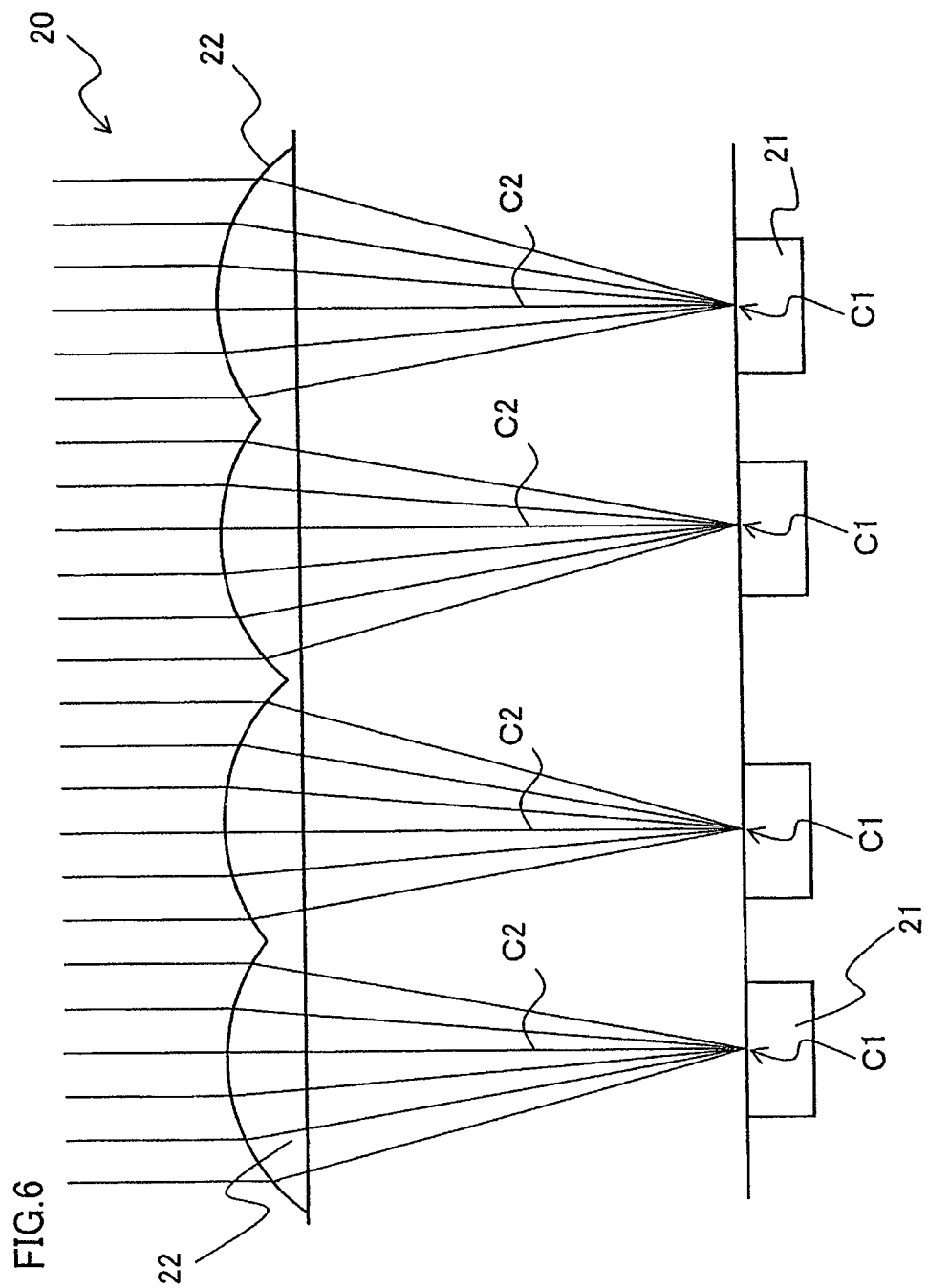
FIG. 6 is a longitudinal cross-sectional view schematically showing a portion cut at line B-B' in FIG. 5.

FIG. 5 is a plane view showing an exemplary essential structure of a pixel section in a solid-state image capturing device 20 according to Embodiment 2 of the present invention. FIG. 6 is a longitudinal cross-sectional view schematically showing a portion cut at line B-B' in FIG. 5.

In the solid-state image capturing device 20 according to Embodiment 2 in FIG. 5 and FIG. 6, microlenses 22 are arranged above photodiodes 21 making up pixels so as to correspond to the photodiodes 21. The locations of the photodiodes 21 are different according to a sequence in each pixel unit. In a plane view, the center position C1 of a photodiode 21 unit matches the optical axis C2 of a corresponding microlens 22. The curvature of a microlens 22 in the solid-state image capturing device 20 is more constant than that in the solid-state image capturing device 10 according to Embodiment 1. The shape of the microlens 22 is circular and is a partial sphere in a plane view. Two adjacent pixels in a row direction (lateral direction) are formed so as to overlap each other. Herein, the locations of photodiodes 21 in each pixel unit are different according to a sequence only in a column direction (longitudinal direction).

Two microlenses 22 which are located above the respective photodiodes 21 making up pixels are formed so as to overlap each other with a large amount thereof at the location where the two adjacent photodiodes 21 are positioned close to each other, so that the microlenses 22 are arranged above the photodiodes 21 so as to correspond to the photodiodes 21. In addition, two microlenses 22 which are located above the respective photodiodes 21 are formed so as to overlap each other with a small amount thereof at the location where the two adjacent photodiodes 21 are far from each other. As such, microlenses 12 are arranged in a direction in which the locations of microlenses 22 in each two-pixel unit are different according to a sequence (row direction).

Therefore, light of an image that is incident upon each of the microlenses 22 from right above is focused upon the center position C1 (central portion) of each of the respective photodiodes 21, as shown in FIG. 6. As such, light can be focused upon the central portion of each of the photodiodes 21. Therefore, it is possible to obtain a solid-state image capturing device 20 having an excellent light receiving sensitivity and luminance shading characteristic. When oblique light is incident upon each of the microlenses 22, the light can be focused upon approximately the same position (e.g., central portion or center) upon each of the photodiodes 11 at the central portion of a chip, as in the case of the solid-state image capturing device 10 according to Embodiment 1 shown in FIG. 3. Therefore, it is possible to obtain the same luminance shading characteristic in every pixel.

Further, the curvature of a microlens 22 is constant. As such, it is possible to focus light of an image upon one point. Therefore, it is possible to further improve the light receiving sensitivity. Further, herein, circumferential portions of microlenses 22 overlap each other in all of the four directions (both of the longitudinal directions and both of the lateral directions), and thus it is possible to suppress the existence of the gap. Therefore, it is possible to further improve the light receiving sensitivity.

Hereinafter, an example of a method for manufacturing the solid-state image capturing device 20 according to Embodiment 2 will be described in detail with reference to FIG. 7A and FIG. 7B.

Figure 7B:
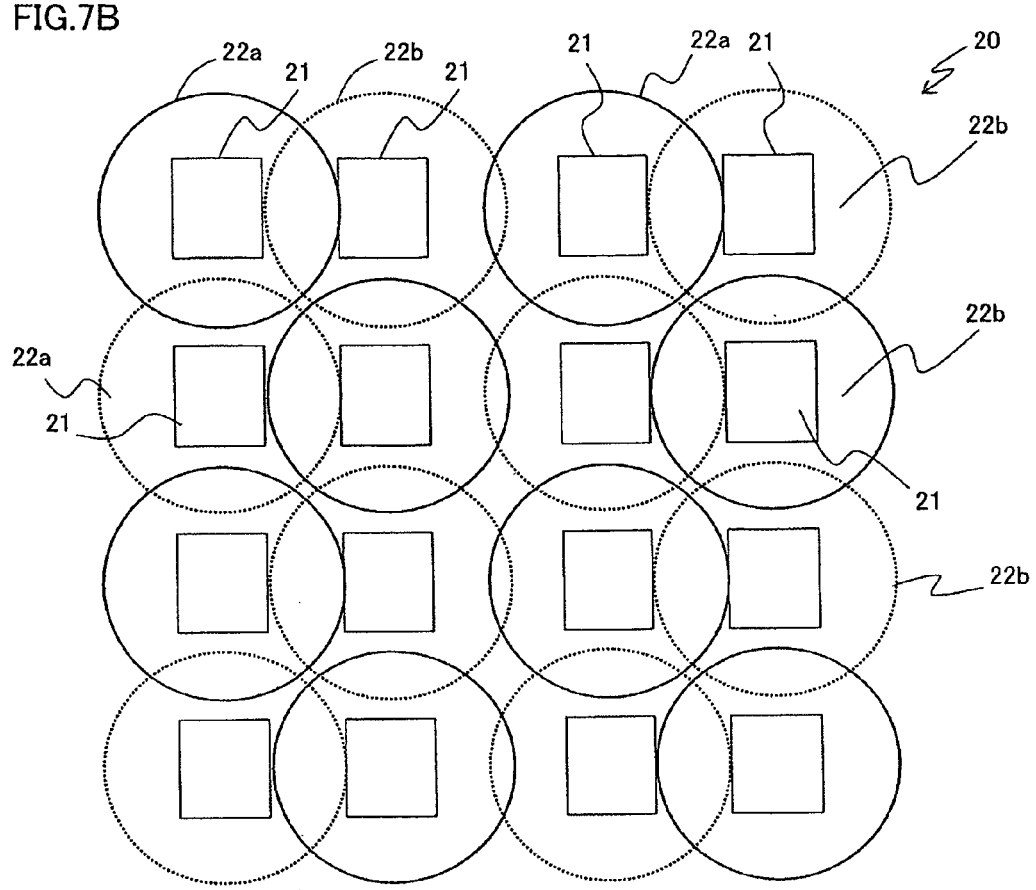
FIG. 7B is a partial view for describing a manufacturing step (2) in the method for manufacturing the solid-state image capturing device according to Embodiment 2.

FIG. 7A to FIG. 7B each are a partial view for describing a step in the method for manufacturing the solid-state image capturing device 20 according to Embodiment 2.

First, as shown in FIG. 7A, on a substrate where a plurality of photodiodes 21 is formed in a matrix, lens materials are provided by photolithography or the like so as to correspond to one of the two photodiodes 21 in each pixel unit having the locations thereof differ according to a sequence. A thermal treatment is performed on the lens materials, so that the first microlenses 22a and the second microlenses 22b having a shape of lens are formed over every other photodiode 21 with no contact between each microlens. In other words, the first microlenses 22a and the second microlenses 22b having a shape of partial sphere (shape obtained by cutting a part of a sphere) in a plane view are formed over every other photodiode 21 in a checkered pattern in a row direction and a column direction.

Next, as shown in FIG. 7B, lens materials provided by photolithography or the like so as to correspond to the other photodiode 11 of the two photodiodes 21 having different locations according to a sequence in each pixel unit. A thermal treatment is performed on the lens materials, so that first microlenses 22a and second microlenses 22b each having a shape of lens located over every other photodiode 21 are formed such that they are not attached to each other. In other words, the first microlenses 22a and the second microlenses 22b having a shape of partial sphere (shape obtained by cutting a part of a sphere) in a plane view are formed over the photodiodes 21, over which the first microlenses 22a and the second microlenses 22b are not formed yet, so as to overlap the ones of the respective previously formed second microlenses 22b and first microlenses 22a.

Conventionally, as described above, when microlenses are attached to each other, there are some cases in which the lenses are pulled away from each other after they are hardened, thus resulting in a deformation of the surface of the lenses, a cause of a crack due to the generation of the internal stress or a state in which the lenses are not usable. As such, in Embodiment 2, one of the microlenses 22 to be overlapped is formed and hardened, and then the other of the microlenses 22 to be overlapped is formed and hardened. Thus, by separately forming the microlenses 22 (first microlenses 22a and second microlenses 22b) in two steps, the problem described above is solved. Therefore, by providing large overlapped portions and small overlapped portions, it is possible to set the locations of the first microlenses 22a and the second microlenses 22b in an arbitrary manner. As described above, the locations of the microlenses 22 can be set in an arbitrary manner. Therefore, for example, the microlenses 22 can be easily arranged at the optimal locations, respectively, such that the center position C1 of each of the photodiodes 21 matches the optical axis C2 of each of the respective microlenses 22, in consideration of the location, light receiving sensitivity and shading characteristic of each of the photodiodes 21.

Generally, the incident angle of light of an image that is incident upon a CCD sensor or CMOS sensor from a microlens increases toward a peripheral position from the center position of a chip (central portion of a light receiving region). Thus, in the CCD sensor or CMOS sensor, in order to improve the luminance shading characteristic, a method is used for off setting relative positions between photodiodes and respective microlenses from the central position (center portion of a light receiving region) of a chip toward a peripheral position of the chip. As a matter of course, even in the solid-state image capturing device 10 according to Embodiment 1 and the solid-state image capturing device 20 according to Embodiment 2, it is possible to sequentially offset relative positions between the photodiodes and the respective microlenses from the central position (central portion of a light receiving region) of a chip toward a peripheral position of the chip while the locations of the microlenses in each pixel unit are different according to a sequence.

In addition, Embodiment 1 and Embodiment 2 have described the solid-state image capturing device 10 and the solid-state image capturing device 20 each having a structure of focusing light of an image upon the central portion of a photodiode by forming a microlens corresponding to the photodiode (structure making the center position C1 of each of the photodiodes 21 match the optical axis position C2 of each of the respective microlens 22). These are for focusing light upon the central portion of each of the photodiodes. However, relative positions between photodiodes and respective microlenses do not always match, especially at a peripheral portion of a chip. As a matter of fact, the light only has to be focused upon the same position on each of the photodiodes, and it does not necessarily have to be focused upon the central portion of each of the photodiodes. Also regarding the curvature of a microlens, the light receiving sensitivity is improved when the curvature thereof is as constant as possible. However, the curvature of a microlens does not have to be constant.

Further, Embodiment 1 and Embodiment 2 have described the case in which microlenses are formed separately in two steps. However, the present invention is not limited to this. It is possible to form microlenses in one step such that at least a part of a circumferential portion of a microlens contacts an adjacent microlens and the locations of microlenses in each pixel unit are different according to a sequence.

Further, Embodiment 1 and Embodiment 2 have described the case in which the locations of microlenses in each two-pixel unit are different according to a sequence. However, the present invention is not limited to this. The present invention can be applied to a case in which the locations of microlenses in each N pixel-unit (N is an integer greater than or equal to 2) are different according to a sequence. In this case, microlenses can be formed in at least N steps such that adjacent microlenses overlap each other. Further, it is possible to form microlenses in one step such that at least apart of a circumferential portion of a microlens contacts an adjacent microlens and the locations of microlenses in each pixel unit are different according to a sequence.

Further, Embodiment 1 and Embodiment 2 have described the case in which the locations of microlenses in each pixel unit are different according to a sequence only in a row direction (horizontal direction). The present invention is not limited to this. The locations of microlenses in each pixel unit only have to be different according to a sequence in a direction in which the locations of respective photodiodes in each pixel unit are different according to a sequence. The locations of the microlenses can be different according to a sequence in each pixel unit only in a column direction (vertical direction). Alternatively, the locations of the microlenses in each pixel unit can be different according to a sequence in both a row direction (horizontal direction) and a column direction (vertical direction).

Embodiment 3

Embodiments 1 and 2 have described the case in which photodiodes 11 or 21 are grouped in two pixels, and the locations of the photodiodes 11 or 21 in each two-pixel unit are different according to a sequence only in a row direction (horizontal direction). Embodiment 3 will describe a case in which photodiodes are grouped in four pixels, and the locations of the photodiodes in each four-pixel unit are different according to a sequence in both a row direction (horizontal direction) and a column direction (vertical direction).

Figure 8:
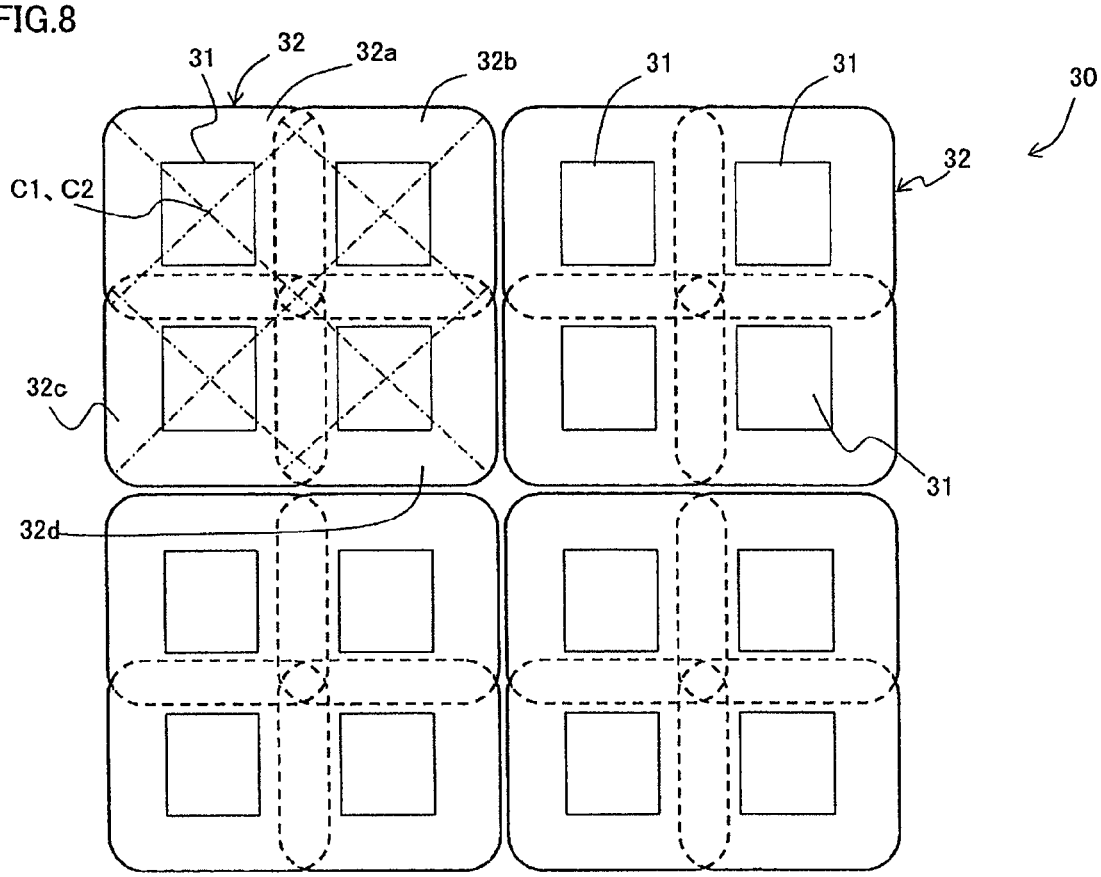
FIG. 8 is a plane view showing an exemplary essential structure of a pixel section in a solid-state image capturing device according to Embodiment 3 of the present invention.

FIG. 8 is a plane view showing an exemplary essential structure of a pixel section in a solid-state image capturing device 30 according to Embodiment 3 of the present invention.

In the solid-state image capturing device 30 according to Embodiment 3 in FIG. 8, one microlens 32 is provided above four photodiodes 31 making up four pixels in a lateral direction and a longitudinal direction so as to correspond to the four photodiodes 31. This one microlens 32 includes four microlenses 32a to 32d corresponding to the four photodiodes 31, respectively, in a plane view. The center position C1 of each of the photodiodes 31 matches the optical axis position C2 of each of the respective microlenses 32a to 32d at the central portion of a chip, and the center position C1 and the optical axis position C2 are offset toward a peripheral portion of the chip, so that light focuses upon a predetermined position of each of the photodiodes 31.

For example, in a CMOS image sensor, when one output amplifier is shared by a plurality of photodiodes, the locations of adjacent photodiodes are not at even intervals. In Embodiment 3, the location of each of the adjacent photodiodes 31 in a row direction (horizontal direction) and a column direction (vertical direction) is different in each pixel. The locations of photodiodes 31 in each two-pixel unit are different according to a sequence in a row direction and in a column direction. The photodiodes 31 are located according to a sequence in each four-pixel unit.

In other words, four microlenses 32a to 32d which are located above the respective photodiodes 31 making up four pixels are structured so as to overlap the respective microlenses 32a to 32d with the same amount thereof at the location where the four adjacent photodiodes 31 are positioned close to each other, so that the microlens 32 is formed above the photodiodes 31. As such, four microlenses are arranged in a four-pixel unit with two out of four microlenses being arranged in a row direction in a two-pixel unit and the other two being arranged in a column direction in a two-pixel unit.

Therefore, the light of an image that is incident upon each of the microlens 32 from right above is focused upon each of the respective photodiodes 31 at the central portion of a chip. As such, since the light can be focused upon the central portion of each of the photodiodes 31, it is possible to obtain a solid-state image capturing device 30 having an excellent light receiving sensitivity and luminance shading characteristic. In addition, even when oblique light is incident upon a microlens 32 at a peripheral portion of a chip, the light can be focused by each of the microlenses 32 upon approximately the same position (the relative positions between the microlenses 32 and the respective photodiodes 31 are offset depending on whether the microlens 32 and the respective photodiode 31 is located at the central portion or peripheral portions of the chip) on each of the respective photodiodes 31, and thus it is possible to obtain the same luminance shading characteristic in every pixel.

Hereinafter, an example of a method for manufacturing the solid-state image capturing device 30 according to Embodiment 3 will be described in detail with reference to FIG. 9.

Figure 9:
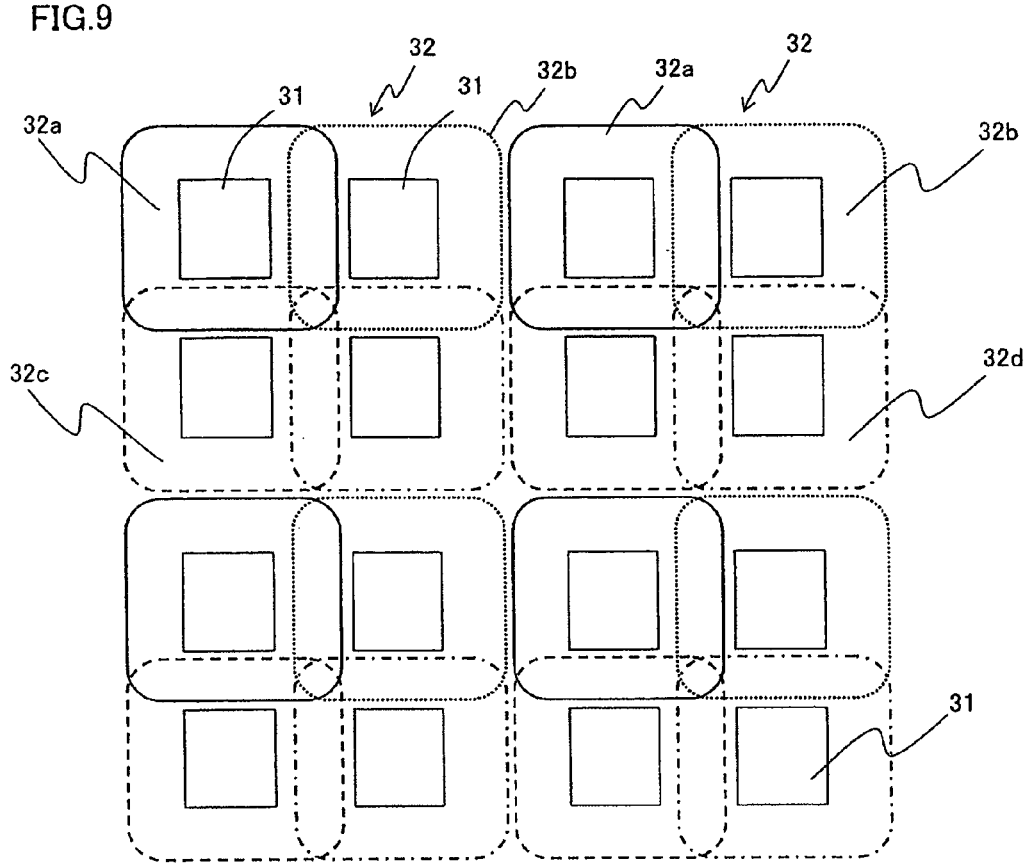
FIG. 9 is a partial plane view for describing manufacturing step in a method for manufacturing the solid-state image capturing device according to Embodiment 3.

FIG. 9 is a partial plane view for describing the method for manufacturing the solid-state image capturing device 30 according to Embodiment 3.

As shown in FIG. 9, among photodiodes 31 in a four-pixel unit, a first microlens 32a is formed above a top left photodiode 31, a second microlens 32b is formed above a top right photodiode 31, a third microlens 32c is formed above a bottom left photodiode 31, and a fourth microlens 32d is formed above a bottom right photodiode 31. They are sequentially formed in four steps so as to overlap portions of the respective microlenses 32a to 32d with the same amount thereof.

As described above, by forming the microlenses 32a to 32d in four steps, the locations of the first microlens 32a, the second microlens 32b, the third microlens 32c and the fourth microlens 32d can be set in an arbitrary manner in accordance with the respective photodiodes 31. As described above, since the locations of the microlenses 32 (microlenses 32a to 32d) can be set in an arbitrary manner, the microlenses 32 (the microlenses 32a to 32d) can, for example, be easily arranged at the optimal locations, respectively, such that the center position C1 of each of the photodiodes 31 matches the optical axis C2 of each of the respective microlenses 32a to 32d, in consideration of the location, light receiving sensitivity and shading characteristic of each of the photodiodes.

Embodiment 4

Embodiment 3 has described the case in which photodiodes are grouped in four pixels, the locations of the photodiodes in each four-pixel unit are different according to a sequence in both a row direction (horizontal direction) and a column direction (vertical direction), and microlenses 32 (microlenses 32a to 32d) are arranged so as to corresponding the four photodiodes, respectively. Embodiment 4 will describe a case in which photodiodes are grouped in four pixels, the locations of the photodiodes in each four-pixel unit are different according to a sequence in both a row direction (horizontal direction) and a column direction (vertical direction), and microlenses 42A (microlenses 32Aa and 42Ab) and microlenses 42B (microlenses 32Ba and 42Bb) are provided so as to correspond to each group of two adjacent photodiodes, respectively, in a lateral direction or a longitudinal direction.

Figure 10:
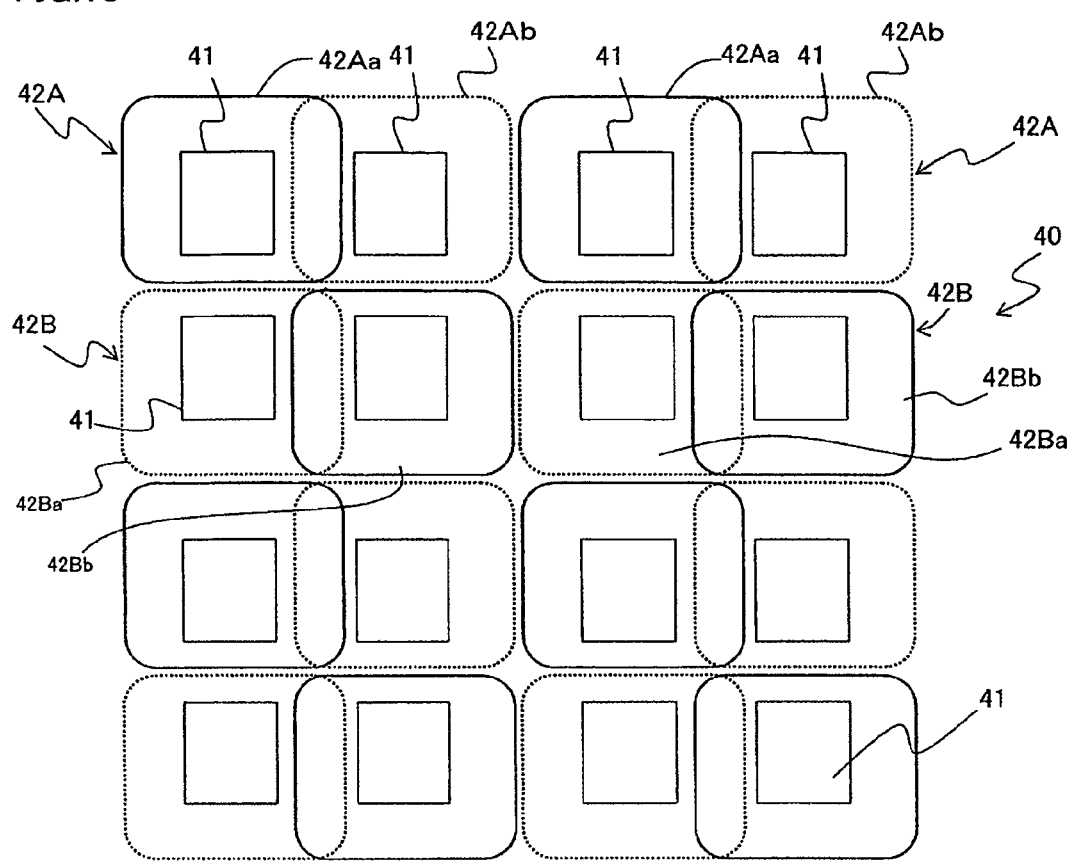
FIG. 10 is a plane view showing an exemplary essential structure of a pixel section in a solid-state image capturing device according to Embodiment 4 of the present invention.

FIG. 10 is a plane view showing an exemplary essential structure of a pixel section in a solid-state image capturing device 40 according to Embodiment 4 of the present invention.

In the solid-state image capturing device 40 according to Embodiment 4 in FIG. 10, among four photodiodes 41 making up four pixels in a lateral direction and a longitudinal direction, one microlens 42A is arranged above two adjacent photodiodes 41 in a longitudinal direction so as to correspond to the two adjacent photodiodes 41, and therebelow, one microlens 42B is arranged above two adjacent photodiodes 41 in the lateral direction so as to correspond to the two adjacent photodiodes 41. The microlenses 42A and 42B include two microlenses 42Aa and 42Ab and two microlenses 42Ba and 42Bb, respectively, which correspond to two photodiodes 41 arranged in a lateral direction in a plane view, respectively. The photodiodes and the respective microlenses are arranged, for example, at the optimal locations where light is focused upon the same position (e.g., central portion) of each of the photodiodes 41 such that the center position C1 of each of the photodiodes 41 matches the optical axis position C2 of each of the respective microlenses 42Aa, 42Ab, 42Ba and 42Bb.

When the solid-state image capturing device 40 having the structure described above is manufactured, the first microlens 42Aa and the fourth microlens 42Bb, and the third microlens 42Ba and the second microlens 42Ab are sequentially formed in two steps such that the second microlens 42Ab overlaps the first microlens 42Aa, and the third microlens 42Ba overlaps the fourth microlens 42Bb, as shown in FIG. 10.

In this case, although the location of the microlens 42 (first microlens 42Aa to fourth microlens 42Bb) with respect to the location of each of the photodiodes 41 is slightly offset in a column direction, it is possible to reduce the number of the steps of forming the microlens 42 (first microlens 42Aa to fourth microlens 42Bb) to two steps.

Embodiment 5

Embodiment 5 will describe a case in which the microlenses 32a to 32d according to Embodiment 3 are circular (or approximate circular or elliptical) in a plane view, and the curvature thereof is constant.

Figure 11:
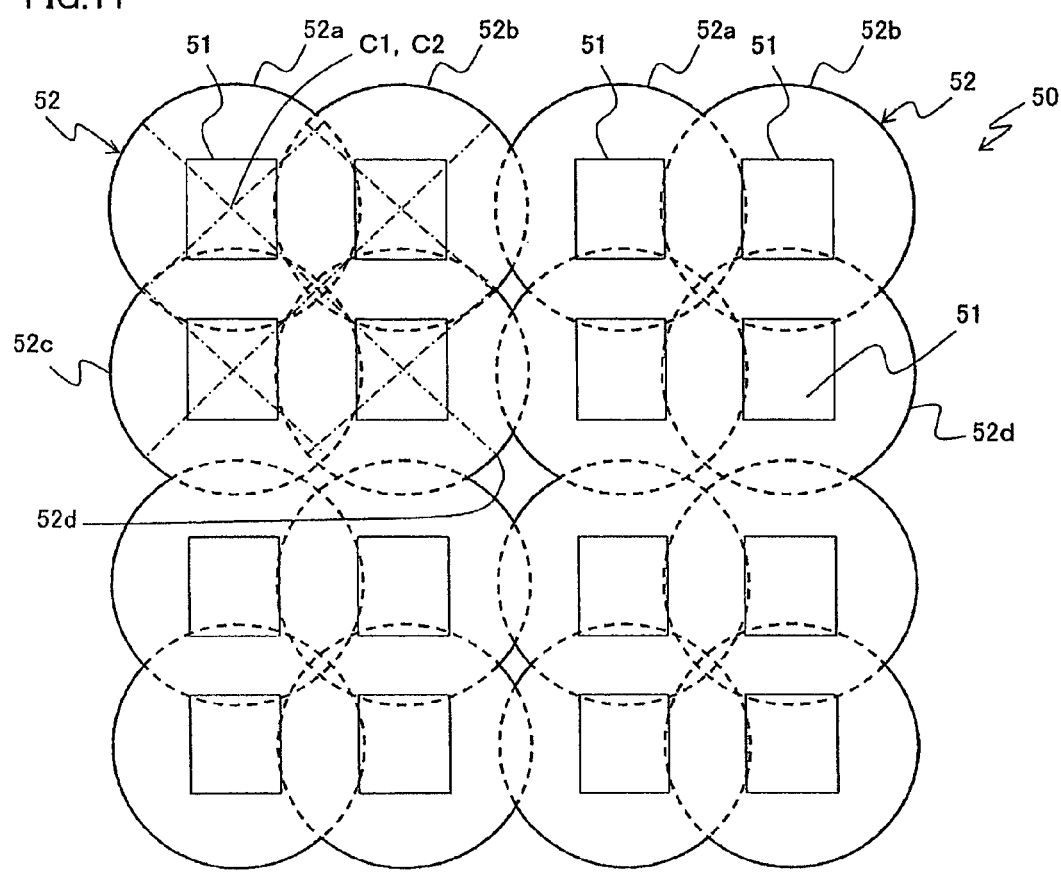
FIG. 11 is a plane view showing an exemplary essential structure of a pixel section in a solid-state image capturing device according to Embodiment 5 of the present invention.

FIG. 11 is a plane view showing an exemplary essential structure of a pixel section in a solid-state image capturing device 50 according to Embodiment 5 of the present invention.

In the solid-state image capturing device 50 according to Embodiment 5 in FIG. 11, microlenses 52 are arranged above four photodiodes 51 making up pixels in a four-pixel unit so as to correspond to the four photodiodes 51. The locations of the photodiodes 51 in each four-pixel unit are different according to a sequence. For example, the center position C1 of each of the photodiodes 51 matches the optical axis position C2 of each of the respective microlenses 52a to 52d such that the light of an image is focused upon a predetermined position (e.g., central portion) on each of the photodiodes 51 in a plane view. The curvature of microlenses 52a to 52d in the solid-state image capturing device 30 according to Embodiment 5 is more constant than that in the solid-state image capturing device 50 according to Embodiment 3. The shape of the microlenses 52a to 52d is circular and is a partial sphere in a plane view (shape obtained by cutting a part of a sphere or approximate sphere; herein, one side has a lens sphere, but, alternatively, both sides can have a lens sphere). Adjacent microlenses in a row direction (lateral direction) and a column direction (longitudinal direction) are formed so as to overlap each other. Herein, the locations of photodiodes 51 in each pixel unit are different according to a sequence in the row direction (lateral direction) and the column direction (longitudinal direction).

Four microlenses 52a to 52d which are located above the respective photodiodes 51 making up pixels are formed so as to overlap each other with a large amount thereof at the location where the four adjacent photodiodes 51 are positioned close to each other, so that the microlens 52 (microlenses 52a to 52d) is arranged above the photodiodes 51 so as to correspond to the photodiodes 51. In addition, four microlenses 52a to 52d which are located above the respective photodiodes 51 are formed so as to overlap each other with a small amount thereof in a lateral direction and a longitudinal direction at the location where the four adjacent photodiodes 51 are positioned far from each other. As such, four microlenses 52a to 52d in a four-pixel unit are arranged according to a sequence with two out of four microlenses being arranged in a row direction in a two-pixel unit and the other two being arranged in a column direction in a two-pixel unit.

Therefore, light of an image that is incident upon each of the microlenses 52a to 52d from right above is focused upon the central portion of each of the respective photodiodes 51. As such, light can be focused upon the central portion of each of the photodiodes 51. Therefore, it is possible to obtain a solid-state image capturing device 50 having an excellent light receiving sensitivity and luminance shading characteristic. When oblique light is incident upon each of the respective microlenses 52a to 52d, the light can be focused upon approximately the same position (e.g., central portion) on each of the photodiodes 51. Therefore, it is possible to obtain the same luminance shading characteristic in every pixel.

Further, the curvature of microlenses 52a to 52d having a shape of circle in a plane view is constant. As such, it is possible to focus light of an image upon one point. Therefore, it is possible to improve the light receiving sensitivity. Further, herein, circumferential portions of microlenses 52a to 52d overlap each other in all of the four directions (longitudinal (column) direction and lateral (row) direction). As such, the size of a gap is small. Therefore, also in this case, it is possible to further improve the light receiving sensitivity.

Hereinafter, an example of a method for manufacturing the solid-state image capturing device 50 according to Embodiment 5 will be described with reference to FIG. 12.

Figure 12:
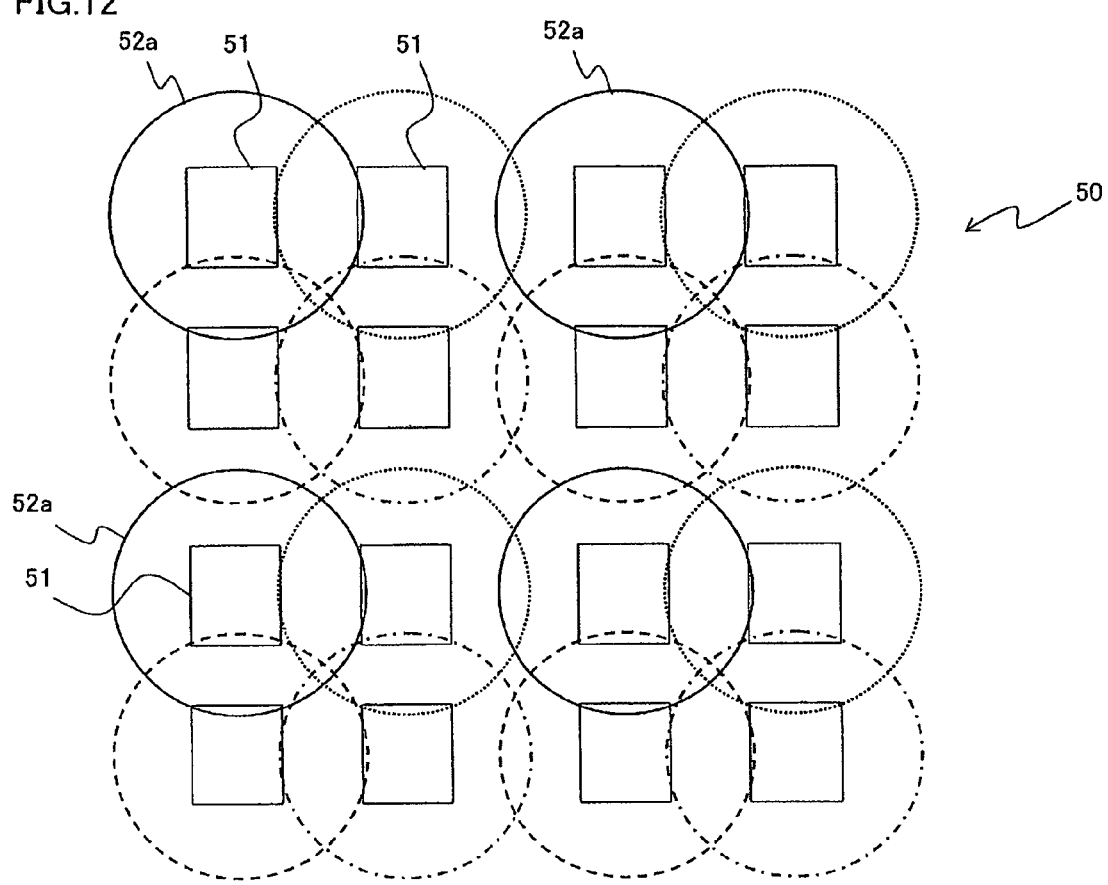
FIG. 12 is a partial plane view for describing manufacturing steps in a method for manufacturing the solid-state image capturing device according to Embodiment 5.

As shown in FIG. 12, the first microlens 52a, the second microlens 52b, the third microlens 52c and the fourth microlens 52d each having a shape of partial sphere are sequentially formed on the respective photodiodes 51 in four steps so as to overlap each other.

In this manner, by separately forming the microlenses 52a to 52d in four steps and providing the same amount of overlapped portions (or large overlapped portions and small overlapped portions), it is possible to set the locations of the first microlens 52a, the second microlens 52b, the third microlens 52c and the fourth microlens 52d in an arbitrary manner. As described above, the locations of the microlenses 52a to 52d can be set in an arbitrary manner. Therefore, the microlenses 52a to 52d can be easily arranged at the optimal locations, respectively, in consideration of the location, light receiving sensitivity and shading characteristic of each of the photodiodes 51.

As described above, according to Embodiments 1 to 5, microlenses arranged above respective photodiodes are formed such that peripheral portions of the microlenses overlap the respective adjacent microlenses thereto, and the locations of the microlenses in each pixel unit are different according to a sequence. Light of an image that is incident upon each of the microlenses is incident upon approximately the same position (e.g., central portion) on each of the respective photodiodes. As such, in a solid-state image capturing device having the locations of photodiodes in each pixel unit differ according to a sequence, it is possible to improve the light receiving sensitivity and luminance shading characteristic.

Figure 13:
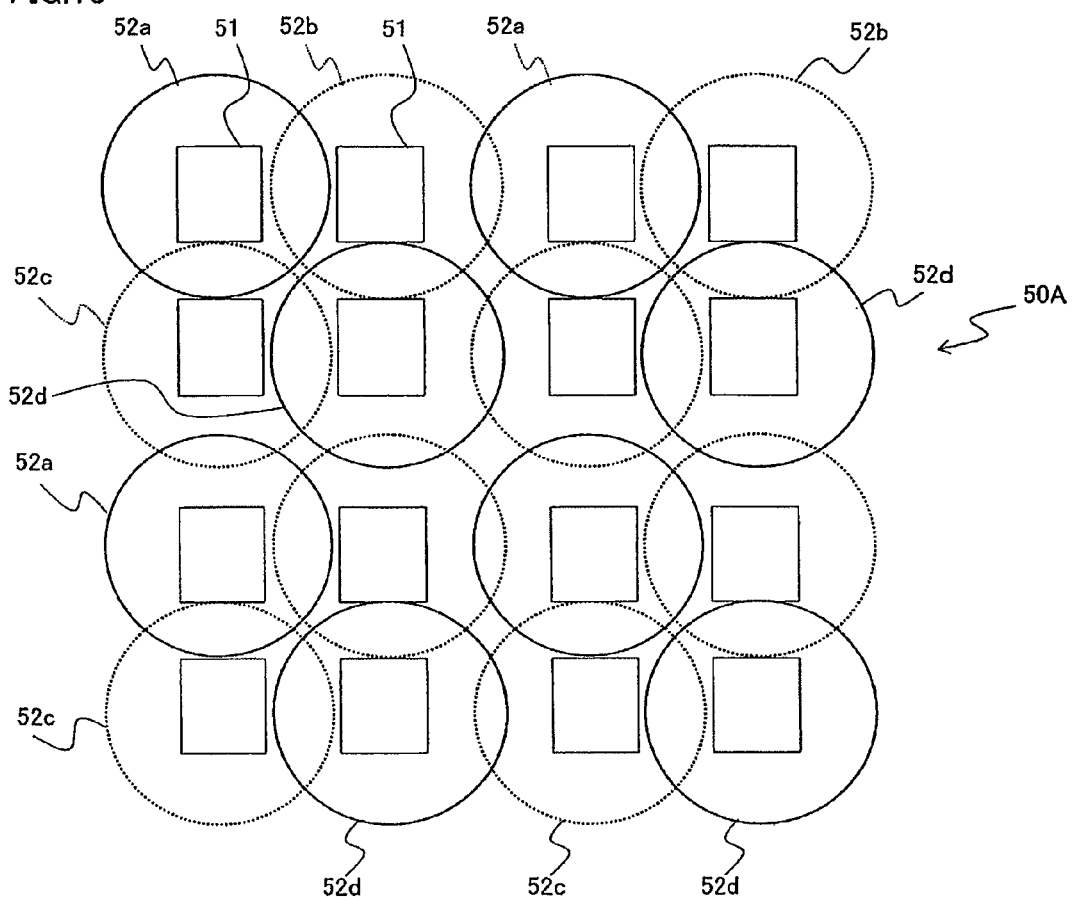
FIG. 13 is a partial plane view for describing manufacturing steps in another method for manufacturing the solid-state image capturing device according to Embodiment 5.
Figure 14:
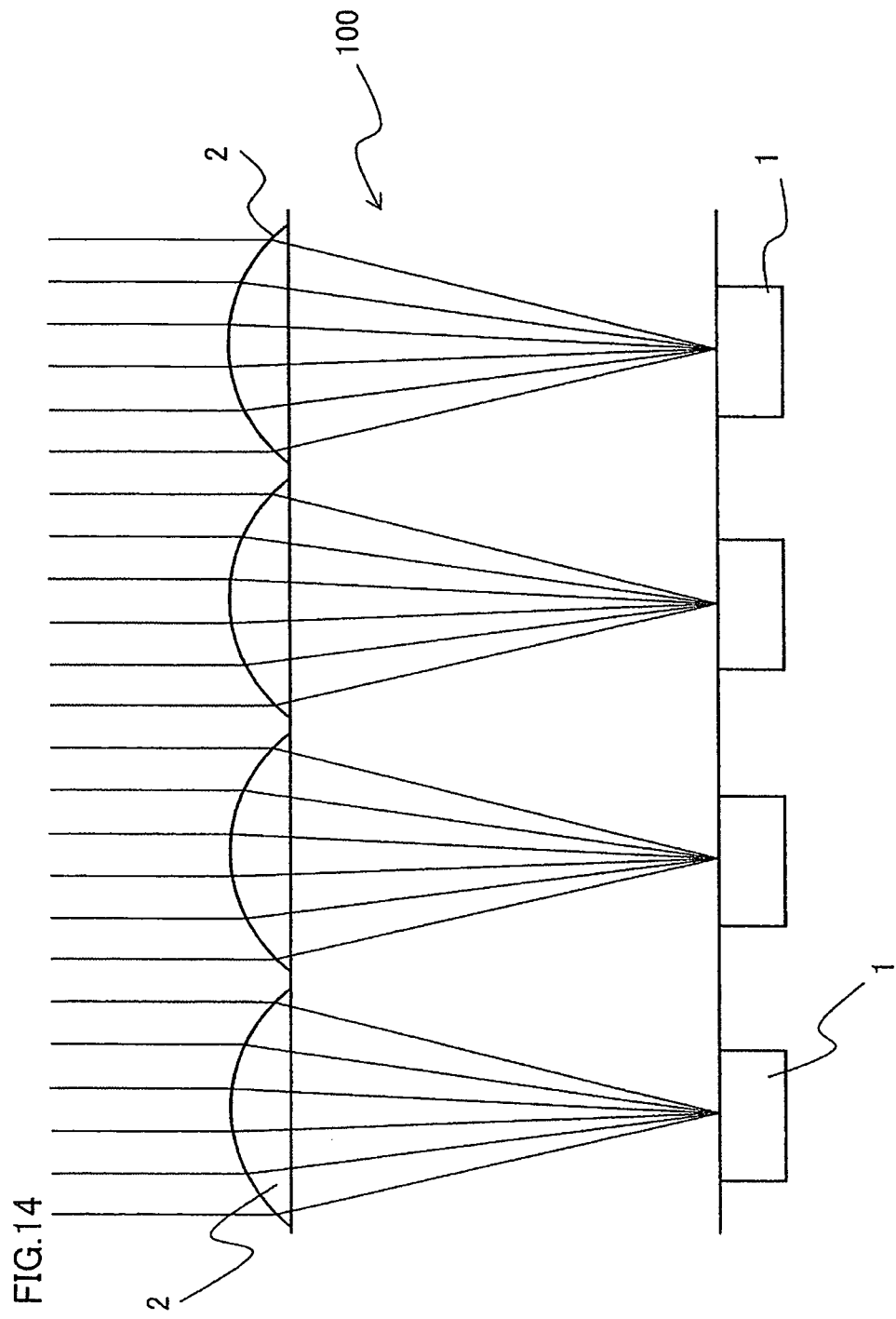
FIG. 14 is a longitudinal cross-sectional view schematically showing an exemplary essential structure of a pixel section in a conventional solid-state image capturing device.
Figure 15:
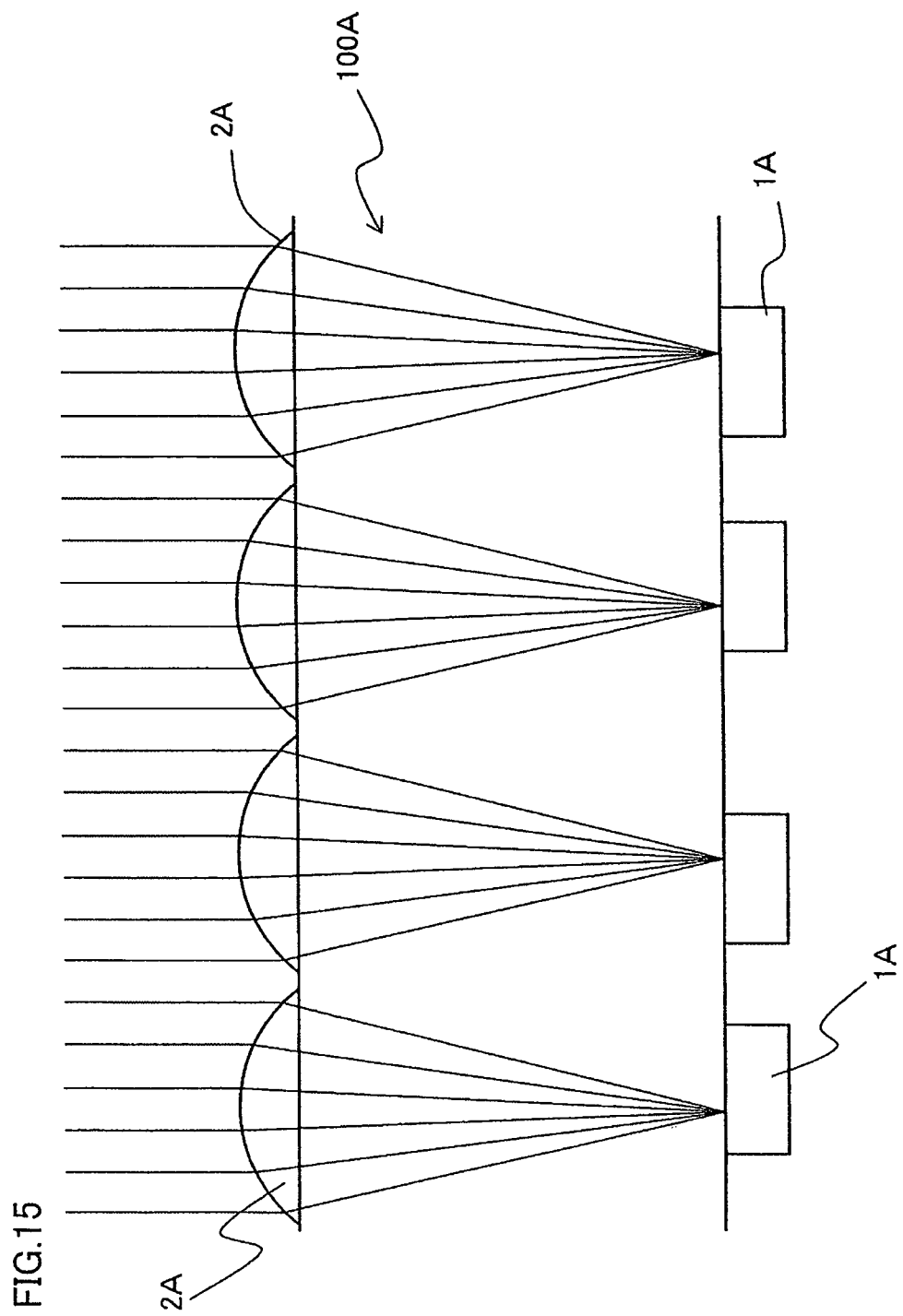
FIG. 15 is a longitudinal cross-sectional view schematically showing an exemplary essential structure of a pixel section in another conventional solid-state image capturing device.

In Embodiment 5, the four microlenses 52a to 52d are structured so as to overlap each other. However, the first microlens 52a and the fourth microlens 52d, and the second microlens 52b and the third microlens 52c are formed so as to not overlap each other, respectively, as shown in FIG. 13. In this case, the first microlens 52a and the fourth microlens 52d, and the second microlens 52b and the third microlens 52c are sequentially formed in two steps. In this case, although the location of each of the four microlens 52a to 52d with respect to the location of each of the respective photodiodes 51 is slightly offset in a column direction, it is possible to reduce the number of the steps of forming the microlens to two steps.

Generally, the incident angle of the light of an image that is incident upon a CCD sensor or CMOS sensor from a microlens increases toward a peripheral position from the center position of a chip (central portion of a light receiving region). Thus, in the CCD sensor or CMOS sensor, in order to improve the luminance shading characteristic, a method is used for offsetting relative positions between photodiodes and respective microlenses from the central position (center portion of a light receiving region) of a chip toward a peripheral position of the chip. As a matter of course, even in the solid-state image capturing device 30 according to Embodiment 3, the solid state image capturing device 40 according to Embodiment 4 and the solid-state image capturing device 50 according to Embodiment 5, it is possible to sequentially offset relative position between the photodiodes and the respective microlenses from the central position (central portion of a light receiving region) of a chip toward a peripheral position of the chip while the locations of microlenses in each pixel unit are different according to a sequence.

In addition, Embodiments 3 to 5 have described the solid-state image capturing device 30, the solid-state image capturing device 40 and the solid-state image capturing device 50 each having a structure of focusing the light of an image upon the central portion of a photodiode by forming a microlens so as to correspond to the photodiode (e.g., structure making the center position C1 of each of the photodiodes match the optical axis position C2 of each of the respective microlens). These are for focusing the light upon a predetermined position (the central portion) of each of the photodiodes. However, the relative positions between the photodiodes and the respective microlenses do not always match, especially at a peripheral portion of a chip. As a matter of fact, the light only have to be focused upon the same position (position near the central portion) on each of the photodiodes, but it does not necessarily have to be focused upon the central portion of each of the photodiodes. Also regarding the curvature of a microlens, the light receiving sensitivity is improved when the curvature thereof is as constant as possible. However, the curvature of a microlens does not have to be constant.

Further, Embodiments 3 to 5 have described the case in which microlenses are formed in two steps or four steps. However, the present invention is not limited to this. It is possible to form microlenses in one step such that at least a part of a circumferential portion of a microlens is in contact with an adjacent microlens and the locations of the microlenses in each pixel unit are different according to a sequence.

Further, Embodiments 3 to 5 have described the case in which the locations of microlenses in each four-pixel unit are different according to a sequence with two out of four microlenses being arranged in a row direction in a two-pixel unit and the other two being arranged in a column direction in a two-pixel unit. However, the present invention can be applied to a case even when the locations of the microlenses are different according to a sequence in each K-pixel unit (K=I× J) with I pixels (I is an integer greater than or equal to 2) in a row direction and J pixels (J is an integer greater than or equal to 2) in a column direction. In this case, it is possible to form microlenses in I steps, J steps or K steps such that adjacent microlenses overlap each other. Further, it is possible to form microlenses in one step such that at least a part of a circumferential portion of a microlens is in contacts with an adjacent microlens thereto and the locations of microlenses are different according to a sequence in each pixel unit.

Further, Embodiments 1 to 5 have described the case in which when some or all of the adjacent microlenses among the microlenses are close to each other such that the peripheral portions of the respective microlenses overlap, microlenses having a shape of lens with the overlapped lens portions thereof cut off are arranged so as to be adjacent each other, such that light that is incident upon each of the microlenses is focused upon the same position (central portion) on the corresponding photodiode. As a matter of fact, it is ideal to focus light upon the same position (central portion) on each of the photodiodes. However, the rare cases in which each of the microlenses cannot be formed right above the same position on each of the respective photodiodes due to the restriction of the fabrication process. As such, the light focusing range includes the same position on each of the photodiodes and positions in the vicinity thereof. In other words, the location on a photodiode upon which light is focused includes a predetermined positional range on the photodiode which shows the same luminance characteristic in each pixel and does not show a different luminance shading characteristic in each pixel. In any event, some or all of the adjacent microlenses are close to each other and the peripheral portions of the respective microlenses overlap such that the light that is incident on each of the microlenses does not spill from the corresponding photodiode and it is focused only upon the corresponding photodiode.

Further, Embodiments 1 to 5 have described the case in which the solid-state image capturing device according to the present invention is applied to a CMOS image sensor, and one output amplifier is shared by a predetermined number of photodiodes. However, the present invention is not limited to this. The solid-state image capturing device according to the present invention can be applied to a CCD image sensor.

Further, Embodiments 1 to 5 have made no specific description. Herein, a description will be given regarding an electronic information device having, for example, a digital camera (e.g., digital video camera, digital still camera), an image input camera, and an image input device (e.g., scanner, facsimile and cell phone device equipped with camera) using any one of the solid-state image capturing devices 10 to 50 according to Embodiments 1 to 5 for an image capturing section thereof. The electronic information device according to the present invention includes at least one of: a memory section (e.g., recording media) for data-recording of a high-quality image data obtained by using any one of the solid-state image capturing devices 10 to 50 according to Embodiments 1 to 5 of the present invention for the image capturing section after a predetermined signal process is performed on the image data for recording; display means (e.g., liquid crystal display device) for displaying this image data on a display screen (e.g., liquid crystal display screen) after a predetermined signal process is performed on the image data for display; communication means (e.g., transmitting and receiving device) for communicating this image data after a predetermined signal process is performed on the image data for communication; and image output means for printing (typing out) and outputting (printing out) this image data.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in a field of: a solid-state image capturing device in which the locations of adjacent photoelectrical conversion sections in each pixel unit are different according to a sequence, and the light of an image from a subject is photoelectrically converted at each of the photoelectrical conversion sections and is then image-captured; a method for manufacturing the solid-state image capturing device; and an electronic information device (e.g., digital camera (digital video camera, digital still camera or the like), image input camera, scanner, facsimile, cell phone device equipped with camera and the like) using the solid-state image capturing device as an image input device for an image capturing section thereof, the locations of microlenses in each pixel unit are different according to a sequence in a direction in which the locations of photodiodes are different. Therefore, it is possible to improve the sensitivity in each pixel, and also possible to improve the luminance shading characteristic. Therefore, it is possible to make light incident upon approximately the same position on each of the photodiodes. Therefore, it is possible to make the luminance shading characteristic uniform on pixels in each pixel unit having the locations thereof different according to a sequence. By forming microlenses at a plurality of steps, it is possible to easily set the microlenses at the optimal positions, in consideration of the location, light receiving sensitivity and luminance shading characteristic of each of the photodiodes. In addition, making at least a part of the circumferential portions of the microlenses to be in contact with the adjacent microlenses thereof and making the locations of the microlenses in each pixel unit different according to a sequence, it is possible to reduce the number of forming the microlenses.

The invention claimed is:

1. A solid-state image capturing device, comprising:
a plurality of light receiving sections arranged such that locations thereof in each pixel unit are different according to a sequence; and
microlenses arranged above the plurality of light receiving sections so as to correspond to the plurality of light receiving sections,
wherein
some or all of adjacent microlenses among the microlenses are close to each other such that their respective peripheral portions overlap, and the microlenses are formed with a shape of lens where overlapped lens portions thereof are cut off so the microlenses are adjacent to each other such that the microlenses have flat portions in contact with flat portions of adjacent microlenses, and light incident upon each of the microlenses is focused upon the same position on a corresponding light receiving section, and
wherein locations of adjacent microlenses are different, with respect to corresponding adjacent light receiving sections, in accordance with gaps of different size between corresponding adjacent light receiving sections, a contact area of the flat portions of adjacent microlenses is different in accordance with gaps of different size between the corresponding adjacent light receiving sections, and the overlapped lens portions are completely cut off to form the flat portions of the adjacent microlenses contacting each other.

2. A solid-state image capturing device according to claim 1, wherein the adjacent microlenses are formed such that at least a part of the peripheral portions of the microlenses overlaps adjacent microlenses thereto.

3. A solid-state image capturing device according to claim 1, wherein the adjacent microlenses are formed such that the adjacent microlenses having a shape of lens with the overlapped lens portions thereof cut off are arranged so as to be in contact with each other.

4. A solid-state image capturing device according to claim 1, wherein the adjacent microlenses are formed such that the adjacent microlenses having a shape of lens with the overlapped lens portions thereof cut off are arranged so as to be away from each other by a predetermined gap.

5. A solid-state image capturing device according to claim 1, wherein the light receiving sections and the microlenses are arranged such that the locations of the light receiving sections and the microlenses in each two-pixel unit are different according to a sequence.

6. A solid-state image capturing device according to claim 1, wherein the light receiving sections and the microlenses are arranged such that the locations of the light receiving sections and the microlenses in each N-pixel unit (N is an integer greater than or equal to 3) are different according to a sequence.

7. A solid-state image capturing device according to claim 1, wherein the light receiving sections and the microlenses are arranged in a matrix, and the locations of the light receiving sections and the microlenses in each four-pixel unit are different according to a sequence with two out of four light receiving sections and corresponding two out of four microlenses being arranged in a row direction and the other two light receiving sections and microlenses being arranged in a column direction.

8. A solid-state image capturing device according to claim 1, wherein the light receiving sections and the microlenses are arranged in a matrix, and the locations of the light receiving sections and the microlenses in each K pixel unit (K=I×J), with I pixels (I is an integer greater than or equal to 2) in a row direction and J pixels (J is an integer greater than or equal to 2) in a column direction, are different according to a sequence.

9. A solid-state image capturing device according to claim 1, wherein the light receiving sections and the microlenses are arranged such that the locations of the light receiving sections and the microlenses in each two-pixel unit are different according to a sequence, and two microlenses are arranged above two adjacent light receiving sections in each two-pixel unit so as to correspond to the two adjacent light receiving sections, and the two microlenses overlap or are in contact with each other.

10. A solid-state image capturing device according to claim 1, wherein the light receiving sections and the microlenses are arranged in a matrix, and the locations of the adjacent microlenses in each two-pixel unit are different according to a sequence in one of a row direction and a column direction.

11. A solid-state image capturing device according to claim 9, wherein the light receiving sections and the microlenses are arranged in a matrix, and the locations of the adjacent microlenses in each two-pixel unit are different according to a sequence in one of a row direction and a column direction.

12. A solid-state image capturing device according to claim 1, wherein the light receiving sections and the microlenses are arranged such that the locations of the light receiving sections and the microlenses in each N-pixel unit (N is an integer greater than or equal to 3) are different according to a sequence, and N microlenses in each N-pixel unit (N is an integer greater than or equal to 3) are arranged above N adjacent light receiving sections so as to correspond to the N adjacent light receiving sections, and the N microlenses overlap or are in contact with each other.

13. A solid-state image capturing device according to claim 1, wherein the light receiving sections and the microlenses are arranged in a matrix, and the locations of the adjacent microlenses in each N-pixel unit (N is an integer greater than or equal to 3) are different according to a sequence in one of a row direction and a column direction.

14. A solid-state image capturing device according to claim 12, wherein the light receiving sections and the microlenses are arranged in a matrix, and the locations of the adjacent microlenses in each N-pixel unit (N is an integer greater than or equal to 3) are different according to a sequence in one of a row direction and a column direction.

15. A solid-state image capturing device according to claim 1, wherein the light receiving sections and the microlenses are arranged in a matrix, and the locations of the microlenses in each four-pixel unit are different according to a sequence with two out of four light receiving sections and corresponding two out of four microlenses being arranged in a row direction and the other two light receiving sections and microlenses being arranged in a column direction, and the four microlenses are arranged above four adjacent light receiving sections in each four-pixel unit so as to correspond to the four adjacent light receiving sections, and the four microlenses overlap or are in contact with each other.

16. A solid-state image capturing device according to claim 1, wherein the light receiving sections and the microlenses are arranged in a matrix, and the locations of the microlenses in each K-pixel unit (K=I.times.J) are different according to a sequence with I pixels (I is an integer greater than or equal to 2) in a row direction and J pixels (J is an integer greater than or equal to 2) in a column direction, and the microlenses are arranged above adjacent light receiving sections in each K-pixel unit so as to correspond to the adjacent light receiving sections, and the microlenses overlap or are in contact with each other.

17. A solid-state image capturing device according to claim 1, wherein a shape of the microlens is formed in a circular, an approximate circular or an ellipse in a plain view, and a curvature thereof set to be constant.

18. A solid-state image capturing device according to claim 1, wherein peripheral portions of the microlens are formed so as to overlap or be in contact with adjacent microlenses thereto in two directions, both of the lateral directions or both of the longitudinal directions, or in four directions, both of the lateral directions and both of the longitudinal directions.

19. A solid-state image capturing device according to claim 18, wherein adjacent the microlenses which are located above the respective, adjacent light receiving sections positioned close to each other are formed so as to overlap each other with a large amount thereof at the location where adjacent light receiving sections are positioned close to each other, and the adjacent microlenses which are located above the respective light receiving sections positioned far from each other are formed so as to overlap each other with a small amount thereof at the location where adjacent light receiving sections are positioned far from each other.

20. A solid-state image capturing device according to claim 1, wherein the locations of the microlenses in each pixel unit are different according to a sequence, and relative positions between the light receiving sections and the respective microlenses are offset from the center of a chip toward a periphery of the chip, so that light is focused on each of the light receiving sections.

21. A solid-state image capturing device according to claim 1, wherein the location on each of the light receiving sections upon which light is focused is a predetermined positional range on the light receiving section which shows the same luminance characteristic in each pixel.

22. A solid-state image capturing device according to claim 1, wherein the location on each of the light receiving sections upon which light is focused is the same position on each of the light receiving sections.

23. A solid-state image capturing device according to claim 1, wherein the location on each of the light receiving sections upon which light is focused is the central portion on each of the light receiving sections.

24. A solid-state image capturing device according to claim 1, wherein the light receiving sections are photoelectrical conversion sections for performing a photoelectrical conversion on light.

25. A solid-state image capturing device according to claim 1, wherein the solid-state image capturing device is a CCD image sensor or a CMOS image sensor.

26. A solid-state image capturing device according to claim 1, wherein one output amplifier is shared by each group of a predetermined number of light receiving sections.

27. An electronic information device using a solid-state image capturing device according to claim 1 for an image capturing section thereof.

* * * * *